US012753500B2

(12) United States Patent
Dhamodharan et al.

(10) Patent No.: US 12,753,500 B2
(45) Date of Patent: Oct. 6, 2026

(54) INJECTORS, LINERS, PROCESS KITS, PROCESSING CHAMBERS, AND RELATED METHODS FOR GAS FLOW IN BATCH PROCESSING OF SEMICONDUCTOR MANUFACTURING

(71) Applicant: Applied Materials, Inc., Santa Clara, CA (US)

(72) Inventors: Raja Murali Dhamodharan, Madurai (IN); Kalaivanan Mohanadass, Sunnyvale, CA (US); Aniketnitin Patil, San Jose, CA (US); Martin Jeffrey Salinas, San Jose, CA (US); Shu-Kwan Lau, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 826 days.

(21) Appl. No.: 18/122,484

(22) Filed: Mar. 16, 2023

(65) Prior Publication Data

US 2024/0254627 A1 Aug. 1, 2024

(30) Foreign Application Priority Data

Jan. 27, 2023 (IN) ............................. 202341005344

(51) Int. Cl.
*C23C 16/455* (2006.01)
*C23C 16/458* (2006.01)
(Continued)

(52) U.S. Cl.
CPC .... *C23C 16/45563* (2013.01); *C23C 16/4586* (2013.01); *C30B 25/12* (2013.01); *C30B 25/14* (2013.01)

(58) Field of Classification Search
CPC .......... C23C 16/45563; C23C 16/4586; C30B 25/12; C30B 25/14
(Continued)

(56) References Cited

U.S. PATENT DOCUMENTS

| | | | |
|---|---|---|---|
| 8,673,081 | B2 | 3/2014 | Sivaramakrishnan et al. |
| 9,570,330 | B2 | 2/2017 | Hofmeister et al. |

(Continued)

FOREIGN PATENT DOCUMENTS

| | | |
|---|---|---|
| CN | 111725114 A | 9/2020 |
| CN | 113990780 A | 1/2022 |

(Continued)

OTHER PUBLICATIONS

International Search Report and Written Opinion dated May 7, 2024 for Application No. PCT/US2024/011875.

*Primary Examiner* — Charlee J. C. Bennett
(74) *Attorney, Agent, or Firm* — Patterson + Sheridan, LLP

(57) ABSTRACT

Embodiments of the present disclosure relate to injectors, liners, process kits, processing chambers, and related methods for gas flow in batch processing operations. In one or more embodiments, the liners facilitate gas flow uniformity in batch processing. In one or more embodiments, a liner includes a plurality of inlet openings on an inlet side, the plurality of inlet openings extending into an outer face of the liner. The plurality of inlet openings include a plurality of first inlet openings that include a first row extending into a first side face, and a second row extending into a second side face. The plurality of inlet openings include a plurality of second inlet openings extending between an inner face and the outer face. The liner includes one or more outlet openings on an outlet side. The outlet side opposes the inlet side. The one or more outlet openings extend into the inner face.

20 Claims, 17 Drawing Sheets

(51) Int. Cl.
*C30B 25/12* (2006.01)
*C30B 25/14* (2006.01)

(58) Field of Classification Search
USPC .......................................................... 118/728
See application file for complete search history.

(56) References Cited

U.S. PATENT DOCUMENTS

| | | | |
|---|---|---|---|
| 9,620,395 | B2 | 4/2017 | Yang et al. |
| 9,640,416 | B2 | 5/2017 | Arai |
| 9,871,350 | B2 | 1/2018 | McLaurin et al. |
| 9,875,895 | B2 | 1/2018 | Yang et al. |
| 10,161,036 | B2 | 12/2018 | Hyon et al. |
| 10,392,702 | B2 | 8/2019 | Jung et al. |
| 10,741,396 | B2 | 8/2020 | Jung et al. |
| 10,755,955 | B2 | 8/2020 | Ishii et al. |
| 10,903,625 | B2 | 1/2021 | McLaurin et al. |
| 11,111,580 | B2 | 9/2021 | Kang et al. |
| 2005/0188923 | A1* | 9/2005 | Cook .................. H01L 21/0262 118/728 |
| 2008/0220150 | A1* | 9/2008 | Merry ..................... C30B 25/14 427/314 |
| 2010/0075488 | A1* | 3/2010 | Collins ............. C23C 16/45551 438/584 |
| 2010/0120259 | A1* | 5/2010 | Vatus .................. C23C 16/4585 438/758 |
| 2012/0009765 | A1* | 1/2012 | Olgado ............. C23C 16/45565 257/E21.09 |
| 2012/0270384 | A1 | 10/2012 | Sanchez et al. |
| 2014/0322897 | A1 | 10/2014 | Samir et al. |
| 2015/0368796 | A1* | 12/2015 | Li ....................... C23C 16/4412 137/561 A |
| 2016/0312359 | A1* | 10/2016 | Dubois ............. H01J 37/32651 |
| 2016/0362813 | A1 | 12/2016 | Bao et al. |
| 2018/0315626 | A1 | 11/2018 | Franklin |
| 2020/0332437 | A1* | 10/2020 | Burrows ............. H01L 21/0254 |
| 2021/0028075 | A1 | 1/2021 | Zhu et al. |
| 2021/0324514 | A1 | 10/2021 | Ye et al. |
| 2021/0324518 | A1 | 10/2021 | de Ridder |
| 2022/0121196 | A1 | 4/2022 | Omori |
| 2022/0162751 | A1 | 5/2022 | Haanstra et al. |
| 2022/0170156 | A1 | 6/2022 | Jdira et al. |
| 2022/0181193 | A1 | 6/2022 | Gao et al. |
| 2022/0189804 | A1 | 6/2022 | Luan et al. |
| 2022/0199444 | A1 | 6/2022 | Oosterlaken et al. |
| 2022/0254668 | A1 | 8/2022 | Oosterlaken et al. |
| 2022/0268520 | A1 | 8/2022 | Oosterlaken et al. |
| 2022/0298643 | A1 | 9/2022 | Kajbafvala et al. |
| 2022/0298672 | A1 | 9/2022 | M'Saad et al. |
| 2022/0301829 | A1 | 9/2022 | Yoshikawa |
| 2022/0301905 | A1 | 9/2022 | Ye et al. |
| 2022/0301906 | A1 | 9/2022 | Naik et al. |
| 2022/0352006 | A1 | 11/2022 | Huang et al. |
| 2022/0359246 | A1 | 11/2022 | Umeoka |
| 2024/0141495 | A1* | 5/2024 | Patil .................... C23C 16/4586 |

FOREIGN PATENT DOCUMENTS

| | | | |
|---|---|---|---|
| CN | 111893567 | B | 2/2022 |
| CN | 114000192 | A | 2/2022 |
| CN | 111254487 | B | 3/2022 |
| CN | 114138030 | A | 3/2022 |
| CN | 114158145 | A | 3/2022 |
| CN | 114351249 | A | 4/2022 |
| CN | 216357351 | U | 4/2022 |
| CN | 110854044 | B | 5/2022 |
| CN | 111235551 | B | 5/2022 |
| CN | 114481311 | A | 5/2022 |
| CN | 114540947 | A | 5/2022 |
| CN | 114540948 | A | 5/2022 |
| CN | 114551331 | A | 5/2022 |
| CN | 114613703 | A | 6/2022 |
| CN | 114743924 | A | 7/2022 |
| CN | 114823428 | A | 7/2022 |
| CN | 114855272 | A | 8/2022 |
| CN | 114883221 | A | 8/2022 |
| CN | 114914181 | A | 8/2022 |
| CN | 114927450 | A | 8/2022 |
| CN | 115020281 | A | 9/2022 |
| CN | 115101432 | A | 9/2022 |
| CN | 115101443 | A | 9/2022 |
| CN | 115101470 | A | 9/2022 |
| CN | 115233303 | A | 10/2022 |
| CN | 115235257 | A | 10/2022 |
| CN | 115274510 | A | 11/2022 |
| CN | 115312432 | A | 11/2022 |
| CN | 115404543 | A | 11/2022 |
| KR | 20100103611 | A | 9/2010 |

* cited by examiner

INJECTORS, LINERS, PROCESS KITS, PROCESSING CHAMBERS, AND RELATED METHODS FOR GAS FLOW IN BATCH PROCESSING OF SEMICONDUCTOR MANUFACTURING

CROSS-REFERENCE TO RELATED APPLICATION

This application claims priority to India provisional patent application serial number 202341005344, filed Jan. 27, 2023, which is herein incorporated by reference in its entirety.

BACKGROUND

Field

Embodiments of the present disclosure relate to injectors, liners, process kits, processing chambers, and related methods for gas flow in batch processing operations. In one or more embodiments, the liners facilitate gas flow uniformity in batch processing.

Description of the Related Art

Semiconductor substrates are processed for a wide variety of applications, including the fabrication of integrated devices and microdevices. One method of processing substrates includes depositing a material, such as a semiconductor material or a conductive material, on a surface of the substrate. For example, epitaxy is one deposition process that deposit films of various materials on a surface of a substrate in a processing chamber.

Non-uniformities can exist during processing. For example, non-uniformities can exist for gas flow (e.g., gas concentrations, gas temperatures, and/or flow rates). The non-uniformities can hinder control and adjustability, thermal uniformity and deposition uniformity, such as center-to-edge film thickness uniformity. Such issues can be exacerbated by relatively complex deposition operations.

Therefore, a need exists for improved apparatus and methods that facilitate reliably providing gas flows in a manner that facilitates gas flow uniformity.

SUMMARY

Embodiments of the present disclosure relate to injectors, liners, process kits, processing chambers, and related methods for gas flow in batch processing operations.

In one or more embodiments, a process kit applicable for disposition in a processing chamber includes an injector. The injector includes an inner face, an outer face opposing the inner face, and a plurality of first inject openings extending between the inner face and the outer face. The plurality of first inject openings include a first row of the first inject openings and a second row of the first inject openings. The injector includes a plurality of second inject openings extending between the inner face and the outer face. The plurality of second inject openings are aligned between the first row and the second row of the first inject openings. The process kit includes a first liner sized and shaped to be disposed inwardly of the injector. The first liner includes an inner face, an outer face opposing the inner face of the first liner, a first side face between the inner face of the first liner and the outer face of the first liner, and a second side face between the inner face of the first liner and the outer face of the first liner. The second side face opposes the first side face. The first liner includes a plurality of inlet openings on an inlet side of the first liner. The plurality of inlet openings extend into the inner face of the first liner and the first side face. The first liner includes one or more outlet openings on an outlet side of the first liner, the outlet side opposing the inlet side, and the one or more outlet openings extending into the inner face of the first liner. The process kit includes a second liner sized and shaped to be supported at least partially by the first liner. The second liner includes an inner face, an outer face opposing the inner face of the second liner, a first side face between the inner face of the second liner and the outer face of the second liner, and a second side face between the inner face of the second liner and the outer face of the second liner. The second side face of the second liner opposes the first side face of the second liner. The second liner includes a plurality of inlet openings on an inlet side of the second liner. The plurality of inlet openings of the second liner extend into the outer face of the second liner. The second liner includes one or more outlet openings on an outlet side of the second liner, the outlet side of the second liner opposing the inlet side of the second liner. The one or more outlet openings extending into the inner face of the second liner.

In one or more embodiments, a liner applicable for disposition in a processing chamber includes an inner face, an outer face opposing the inner face, a first side face between the inner face and the outer face, and a second side face between the inner face and the outer face. The second side face opposes the first side face. The liner includes a plurality of inlet openings on an inlet side, the plurality of inlet openings extending into the outer face. The plurality of inlet openings include a plurality of first inlet openings that include a first row extending into the first side face, and a second row extending into the second side face. The plurality of inlet openings include a plurality of second inlet openings extending between the inner face and the outer face. The liner includes one or more outlet openings on an outlet side. The outlet side opposes the inlet side. The one or more outlet openings extend into the inner face.

In one or more embodiments, a processing chamber applicable for use in semiconductor manufacturing includes a chamber body that includes an internal volume and an injector. The injector includes an inner face, an outer face opposing the inner face, and a plurality of first inject openings extending between the inner face and the outer face. The plurality of first inject openings include a first row of the first inject openings and a second row of the first inject openings. The injector includes a plurality of second inject openings extending between the inner face and the outer face. The plurality of second inject openings are aligned between the first row and the second row of the first inject openings. The processing chamber includes one or more heat sources configured to generate heat, and a substrate support assembly positioned in the internal volume. The substrate support assembly includes a plurality of lift pins, and one or more substrate supports. The processing chamber includes a first liner disposed inwardly of the injector. The first liner includes an inner face, an outer face opposing the inner face of the first liner, a first side face between the inner face of the first liner and the outer face of the first liner, and a second side face between the inner face of the first liner and the outer face of the first liner. The second side face opposes the first side face. The first liner includes a plurality of inlet openings on an inlet side of the first liner, and the plurality of inlet openings extend into the inner face of the first liner and the first side face. The first liner includes one or more outlet openings on an outlet side of the first liner. The outlet side opposes the inlet side, and the one or more outlet openings extend into the inner face of the first liner. The processing chamber includes a second liner supported at least partially by the first liner. The second liner includes an inner face, an outer face opposing the inner face of the second liner, a first side face between the inner face of the second liner and the outer face of the second liner, and a second side face between the inner face of the second liner and the outer face of the second liner. The second side face of the second liner opposes the first side face of the second liner. The second liner includes a plurality of inlet openings on an inlet side of the second liner. The plurality of inlet openings of the second liner extend into the outer face of the second liner. The second liner includes one or more outlet openings on an outlet side of the second liner, the outlet side of the second liner opposes the inlet side of the second liner.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to liners, process kits, processing chambers, and related methods for gas flow in batch processing operations. In one or more embodiments, the liners facilitate gas flow uniformity in batch processing.

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 1:
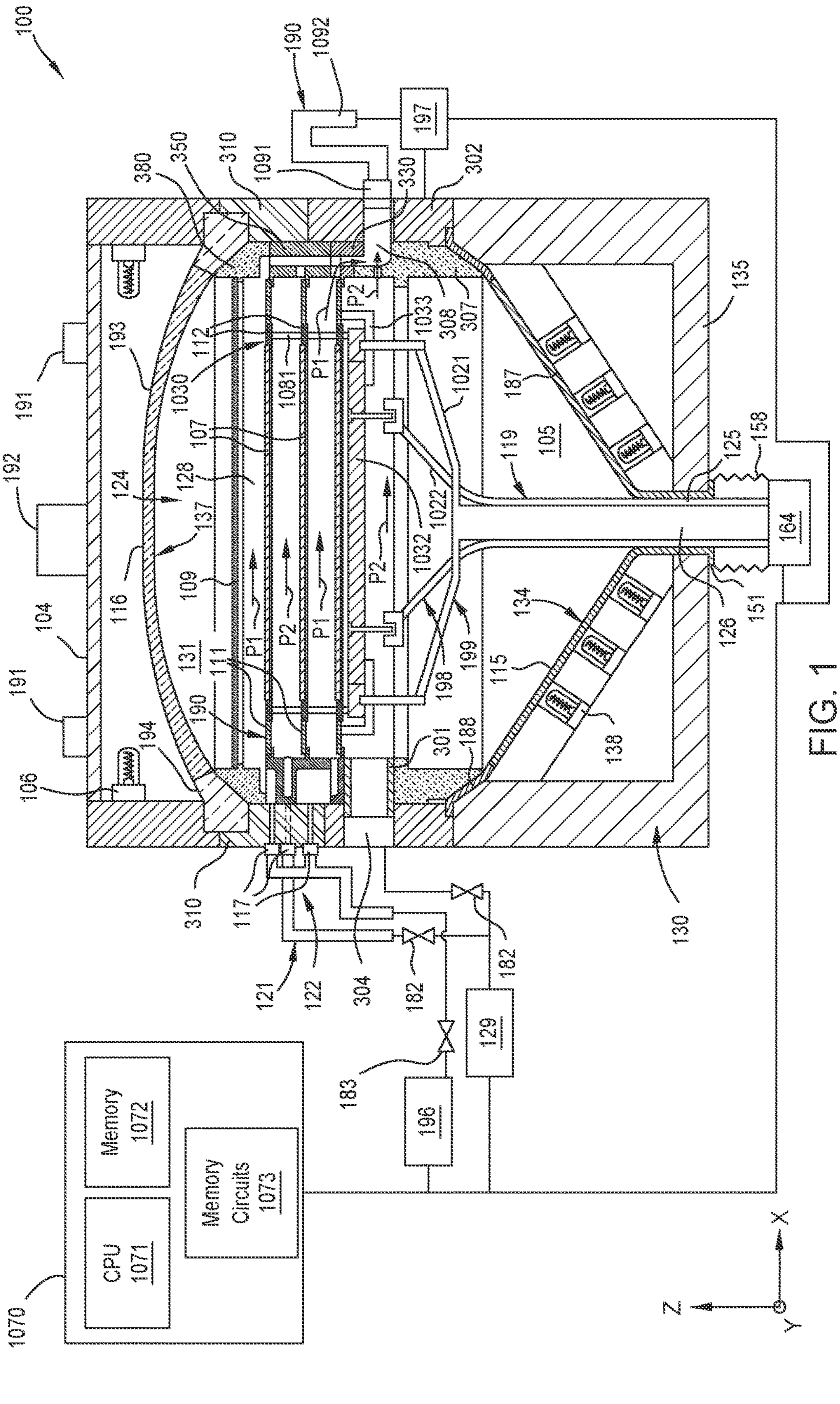
FIG. 1 is a schematic cross-sectional side view of a processing apparatus, according to one or more implementations.
Figure 2:
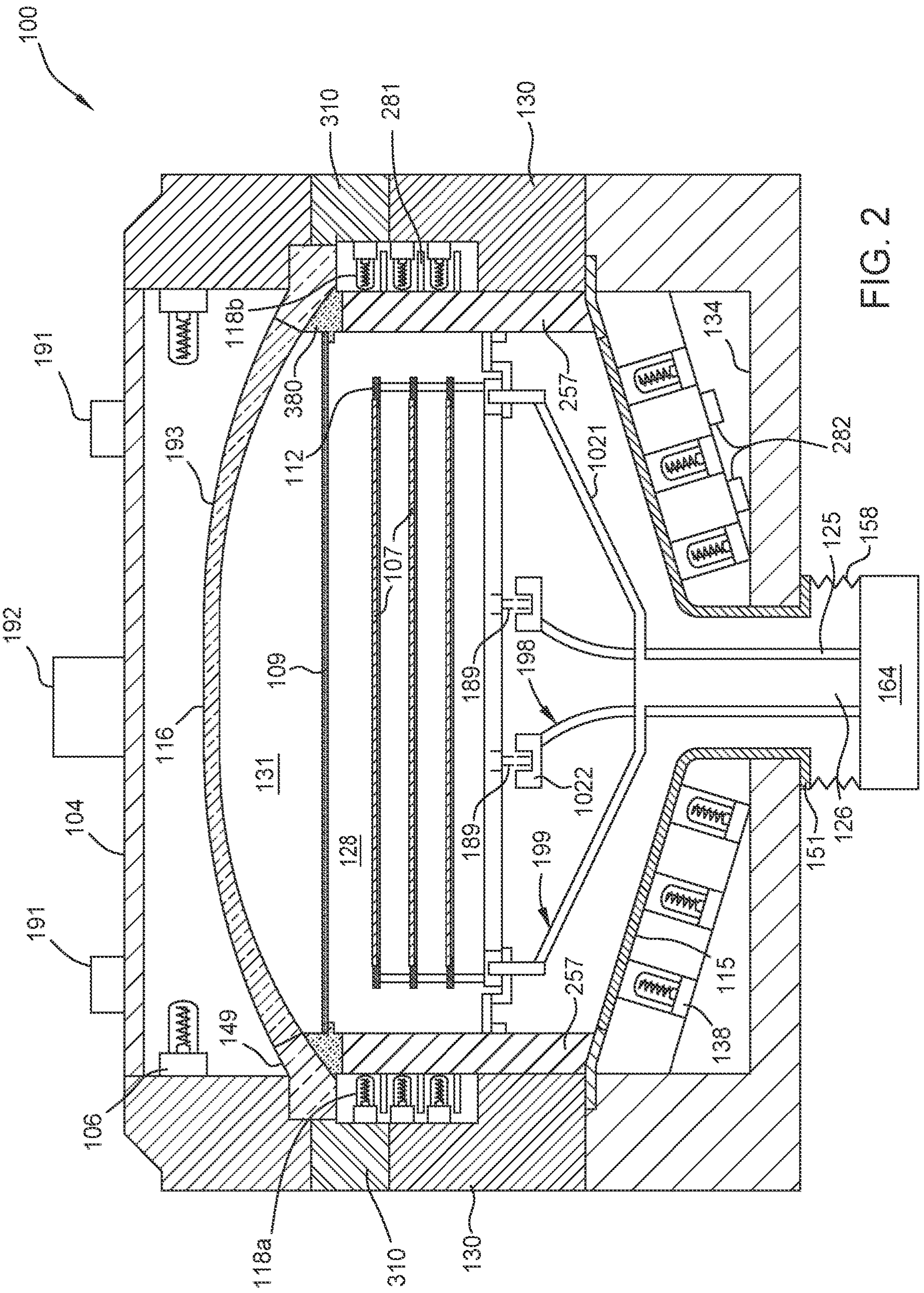
FIG. 2 is a schematic cross-sectional side view of the processing apparatus shown in FIG. 1, according to one or more implementations.

FIG. 1 is a schematic cross-sectional side view of a processing apparatus 100, according to one or more implementations. The side heat sources 118*a*, 118*b* shown in FIG. 2 are not shown in FIG. 1 for visual clarity purposes. The processing apparatus 100 includes a processing chamber having a chamber body 130 that defines an internal volume 124. The processing apparatus 100 includes a plate 109 disposed in the internal volume 124 and at least partially defining a processing volume 128 of the internal volume 124. The plate 109 is discussed further below.

A cassette 1030 is positioned in the processing volume 128 and at least partially supported by a substrate support assembly 119 (such as a pedestal assembly). The cassette 1030 includes a cassette plate 1032 and a plurality of levels that support a plurality of substrates 107 for simultaneous processing (e.g., epitaxial deposition). The present disclosure contemplates that the cassette plate 1032 can be omitted. In the implementation shown in FIG. 1, the cassette 1030 supports three substrates 107. The cassette 1030 can support other numbers of substrates, including but not limited to two substrates 107, four substrates 107, six substrates 107, or eight substrates 107. In one or more embodiments, the cassette 1030 supports two substrates 107 or three substrates 107. The processing apparatus 100 includes an upper window 116, such as a dome, disposed between a lid 104 and the processing volume 128.

The processing apparatus 100 includes a lower window 115 disposed below the processing volume 128. One or more upper heat sources 106 are positioned above the processing volume 128 and the upper window 116. The one or more upper heat sources 106 can be radiant heat sources such as lamps, for example halogen lamps. The one or more upper heat sources 106 are disposed between the upper window 116 and the lid 104. The upper heat sources 106 are positioned to provide uniform heating of the substrates 107. One or more lower heat sources 138 are positioned below the processing volume 128 and the lower window 115. The one or more lower heat sources 138 can be radiant heat sources such as lamps, for example halogen lamps. The lower heat sources 138 are disposed between the lower window 115 and a floor 134 of the internal volume 124. The lower heat sources 138 are positioned to provide uniform heating of the substrates 107.

The present disclosure contemplates that other heat sources may be used (in addition to or in place of the lamps) for the various heat sources described herein. For example, resistive heaters, light emitting diodes (LEDs), and/or lasers may be used for the various heat sources described herein.

The upper and lower windows 116, 115 and/or the plate 109 may be transparent to the infrared radiation, such as by transmitting at least 80% (such as at least 95%) of infrared radiation. The upper and lower windows 116, 115 and/or the plate 109 may be formed of a quartz material (such as a transparent quartz). In one or more embodiments, the upper window 116 includes an inner window 193 and outer window supports 194. The inner window 193 may be a thin quartz window. The outer window supports 194 support the inner window 193 and are at least partially disposed within a support groove. In one or more embodiments, the lower window 115 includes an inner window 187 and outer window supports 188. The inner window 187 may be a thin quartz window. The outer window supports 188 support the inner window 187.

The substrate support assembly 119 is disposed in the processing volume 128. A plurality of liners 307, 330, 350, 380 (described below in relation to FIGS. 3 and 4) are disposed in the processing volume 128 and surround the substrate support assembly 119. The liners 307, 330, 350, 380 facilitate shielding the chamber body 130 from processing chemistry in the processing volume 128. The chamber body 130 includes one or more sidewalls disposed at least partially between the upper window 116 and the lower window 115. The liners 307, 330, 350, 380 are disposed between the processing volume 128 and the chamber body 130. In one or more embodiments, the liners 307, 330, 350, 380 are formed of one or more of quartz (such as transparent quartz, e.g. clear quartz, opaque quartz, and/or black quartz), silicon carbide (SiC), and/or graphite coated with SiC.

The processing apparatus 100 includes a flow guide structure 150 having one or more flow dividers 111 positioned outwardly of the cassette 1030. Three flow dividers 111 are shown in FIG. 1. Other numbers (such as two or four) of the flow dividers 111 may be used. The flow guide structure 150 divides the processing volume into a plurality of flow levels 153 (three flow levels are shown in FIG. 1). In one or more embodiments, the flow guide structure 150 includes at least two (such as at least three) flow levels 153.

The flow guide structure 150 and/or the cassette 1030 are formed of one or more of quartz (such as transparent quartz, e.g. clear quartz, opaque quartz, and/or black quartz), silicon carbide (SiC), or graphite coated with SiC.

Portions (e.g., the one or more flow dividers 111) of the flow guide structure 150 may each act as a pre-heat ring for each flow level 153. The one or more flow dividers 111 can be referred to as one or more pre-heat rings.

As described below, the present disclosure contemplates that the flow guide structure 150 can be omitted.

The substrate support assembly 119 includes a first support frame 199 and a second support frame 198 disposed at least partially about the first support frame 199. The first support frame 199 includes arms coupled to the cassette 1030 such that lifting and lowering the first support frame 199 lifts and lowers the cassette 1030. A plurality of lift pins 189 are suspended from the cassette 1030. Lowering of the cassette 1030 and/or lifting of the second support frame 198 initiates contact of the lift pins 189 with arms of the second support frame 198. Continued lowering of the cassette 1030 and/or lifting of the second support frame 198 initiates contact of the lift pins 189 with the substrates in the cassette 1030 such that the lift pins 189 raise the substrates in the cassette 1030. A bottom region 105 of the processing apparatus 100 is defined between the floor 134 and the cassette 1030.

A first shaft 126 of the first support frame 199, a second shaft 125 of the second support frame 198, and a section 151 of the lower window 115 extend through a port formed in a bottom 135 of the chamber body 130 and the floor 134. Each shaft 125, 126 is coupled to one or more respective motors 164, which are configured to independently raise, lower, and/or rotate the cassette 1030 using the first support frame 199, and to independently raise and lower the lift pins 189 using the second support frame 198. The first support frame 199 includes the first shaft 126 and a plurality of first arms 1021 configured to support the cassette 1030 that includes one or more substrate supports 112. The cassette 1030 includes a plurality of mount columns 1081 that support the arcuate substrate supports 112. The second support frame 198 includes the second shaft 125 and a plurality of second arms 1022 configured to interface with and support the lift pins 189. A bellows assembly 158 circumscribes and encloses a portion of the shafts 125, 126 disposed outside the chamber body 130 to facilitate reduced or eliminated vacuum leakage outside the chamber body 130.

The processing apparatus 100 may include one or more sensors 191, 192, 282, such as temperature sensors (e.g., optical pyrometers) or other metrology sensors, which measure temperatures (or other parameters) within the processing apparatus 100 (such as on the surfaces of the upper window 116, surfaces of the plate assembly 300, and/or one or more surfaces of the substrates 107, the flow guide structure 150, and/or the cassette 1030). The one or more sensors 191, 192 are disposed on the lid 104. The one or more sensors 282 (e.g., lower pyrometers)—which are shown in FIG. 2—are disposed on a lower side of the lower window 115. The one or more sensors 282 can be disposed adjacent to and/or on the bottom 135 of the chamber body 130.

In one or more embodiments, upper sensors 191, 192 are oriented toward a top of the cassette 1030, the plate 109, and/or a top of the flow guide structure 150. In one or more embodiments, side sensors 281 (e.g., side temperature sensors) are oriented toward substrate supports 112 of the cassette 1030. In one or more embodiments, lower sensors 282 are oriented toward a bottom of the cassette 1030 (such as a lower surface of the cassette plate 1032), a bottom of the plate 109, and/or a bottom of the flow guide structure 150.

The processing apparatus 100 includes a controller 1070 configured to control the processing apparatus 100 or components thereof. For example, the controller 1070 may control the operation of components of the processing apparatus 100 using a direct control of the components or by controlling controllers associated with the components. In operation, the controller 1070 enables data collection and feedback from the respective chambers to coordinate and control performance of the processing apparatus 100.

The controller 1070 generally includes a central processing unit (CPU) 1071, a memory 1072, and support circuits 1073. The CPU 1071 may be one of any form of a general purpose processor that can be used in an industrial setting. The memory 1072, or non-transitory computer readable medium, is accessible by the CPU 1071 and may be one or more of memory such as random access memory (RAM), read only memory (ROM), floppy disk, hard disk, or any other form of digital storage, local or remote. The support circuits 1073 are coupled to the CPU 1071 and may include cache, clock circuits, input/output subsystems, power supplies, and the like.

The various methods (such as the method 2300) and operations disclosed herein may generally be implemented under the control of the CPU 1071 by the CPU 1071 executing computer instruction code stored in the memory 1072 (or in memory of a particular processing chamber) as, e.g., a software routine. When the computer instruction code is executed by the CPU 1071, the CPU 1071 controls the components of the processing apparatus 100 to conduct operations in accordance with the various methods and operations described herein. In one embodiment, which can be combined with other embodiments, the memory 1072 (a non-transitory computer readable medium) includes instructions stored therein that, when executed, cause the methods (such as the method 2300) and operations (such as the operations 2302-2312) described herein to be conducted. The controller 1070 can be in communication with the heat sources, the gas sources, and/or the vacuum pump(s) of the processing apparatus 100, for example, to cause a plurality of operations to be conducted.

FIG. 2 is a schematic cross-sectional side view of the processing apparatus 100 shown in FIG. 1, according to one or more implementations. The cross-sectional view shown in FIG. 2 is rotated by 55 degrees relative to the cross-sectional view shown in FIG. 1.

The processing apparatus 100 includes one or more side heat sources 118*a*, 118*b* (e.g., side lamps, side resistive heaters, side LEDs, and/or side lasers, for example) positioned outwardly of the processing volume 128. One or more second side heat sources 118*b* are opposite one or more first side heat sources 118*a* across the processing volume 128.

In FIG. 2, the flow guide structure 150 is not shown for visual clarity purposes. Additionally, the present disclosure contemplates that the flow guide structure 150 can be omitted from the processing apparatus 100 shown in FIGS. 1-2. In such an implementation, process gases and/or purge gases flow into an outer annulus of the processing volume 128 from the liners 330, 350, 380, and then flow into openings 216 between and outwardly of the substrate supports 112 (e.g., arcuate supports) of the cassette 1030, and then into gaps between the substrates 107. The one or more process gases P1 flow out of the gaps, into the openings 216 (between and outwardly of the substrate supports 112) on an exhaust side of the substrates 107, into the outer annulus of the processing volume 128, and out of the processing volume 128 through the liners 330, 350, 380. The present disclosure also contemplates that a plurality of lines (such as conduits) in the processing volume 128 can connect each of the liners 330, 350, 380 to each of the inlet openings of the cassette 1030.

In addition to the one or more sensors 191, 192 positioned above the processing volume 128 and above the second shield plate 1062, the processing apparatus 100 may include one or more sensors 281, such as temperature sensors (e.g., optical pyrometers) or other metrology sensors, which measure temperatures (or other parameters) within the processing apparatus 100 (such as on the surfaces of the upper window 116, on the surfaces of the plate 109, and/or one or more surfaces of the substrates 107, a plurality of windows 257, and/or the cassette 1030). The plurality of windows 257—if used-can be disposed in gaps between or formed in one or more of the liners 307, 330, 350, 380. The one or more sensors 281 are side sensors (e.g., side pyrometers) that are positioned outwardly of the processing volume 128, outwardly of the flow guide structure 150, and outwardly of the plurality of windows 257. The one or more sensors 281 can be radially aligned, for example, with the plurality of windows 257 (as shown in FIG. 2).

The one or more side sensors 281 (such as one or more pyrometers) can be used to measure temperatures within the processing volume 128 from respective sides of the processing volume 128. The side sensors 281 are arranged in a plurality of sensor levels (three sensor levels are shown in FIG. 2). In one or more embodiments, the number of sensor levels is equal to the number of heat source levels. Each side sensor 281 can be oriented horizontally or can be directed (e.g., oriented downwardly at an angle) toward the substrate 107 and the substrate support 112 of a respective level of the cassette 1030.

The present disclosure contemplates that the side heat sources 118*a*, 118*b*, the windows 257, and/or the side sensors 281 can be omitted.

Figure 3:
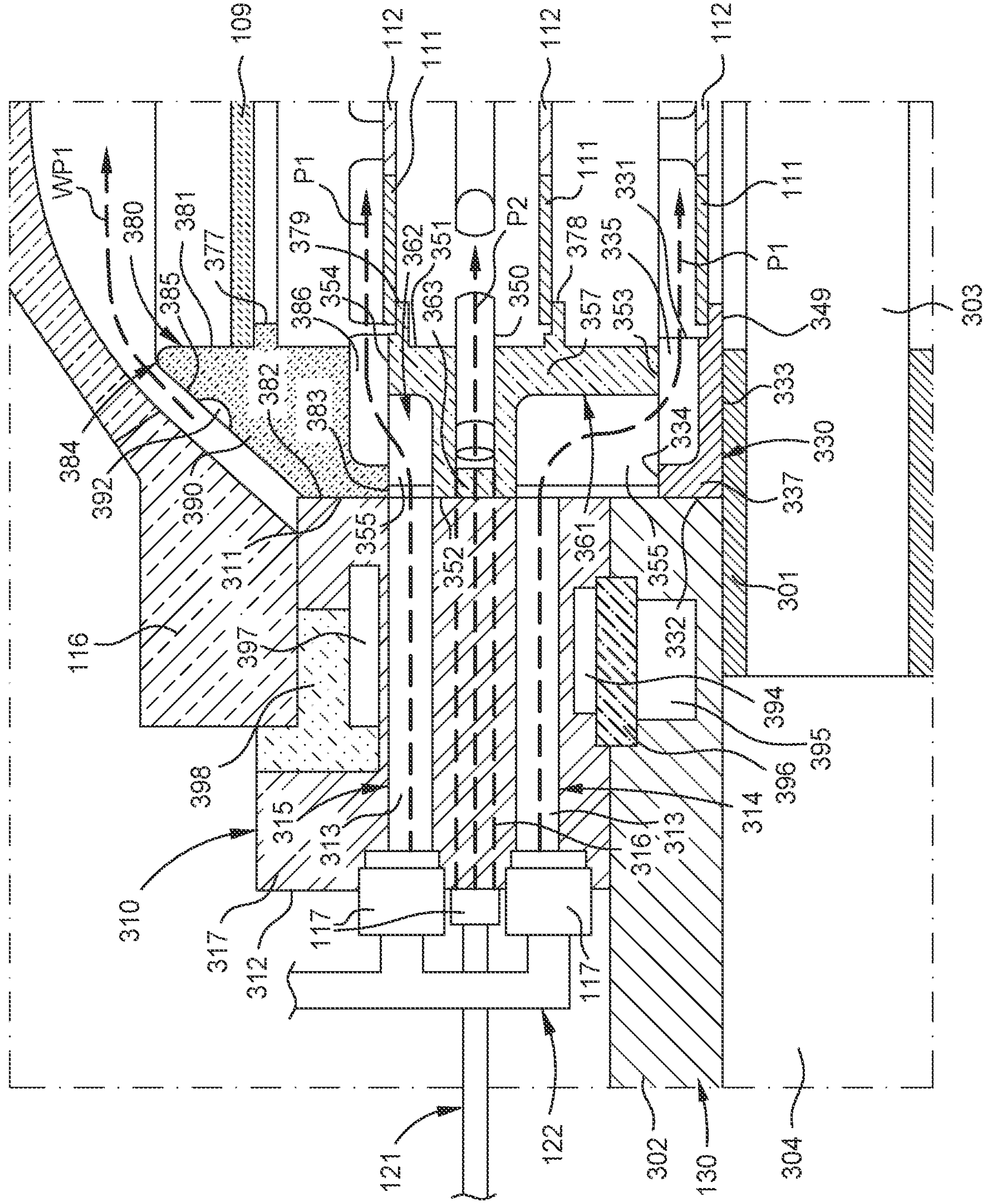
FIG. 3 is a schematic enlarged view of an inlet side of the processing apparatus shown in FIG. 1, according to one or more implementations.

FIG. 3 is a schematic enlarged view of an inlet side of the processing apparatus 100 shown in FIG. 1, according to one or more implementations.

Figure 5:
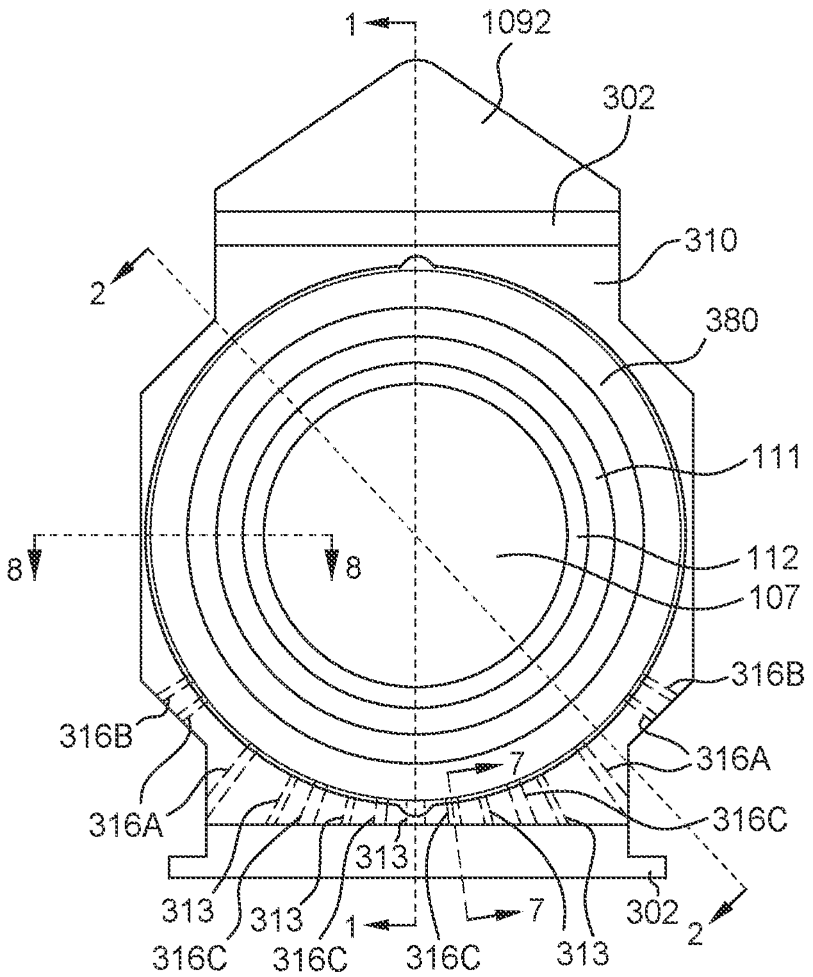
FIG. 5 is a schematic partial top view of the processing apparatus shown in FIG. 1, according to one or more implementations.

The chamber body 130 includes a base 302 (such as a base ring). The base 402 can be rectangular in shape or circular in shape. An insert 301 is disposed partially through the base 302. A process kit includes an injector 310 supported at least partially by the base 302. The injector 310 includes an inner face 311 and an outer face 312 opposing the inner face 311. The injector 310 includes a plurality of first inject openings 313 extending between the inner face 311 and the outer face 312. The plurality of first inject openings 313 include a first row 314 of the first inject openings 313 and a second row 315 of the first inject openings 313. The injector 310 includes a plurality of second inject openings 316 extending between the inner face 311 and the outer face 312. The plurality of second inject openings 316 are aligned between the first row 314 and the second row 315 of the first inject openings 313. In one or more embodiments, the first inject openings 313 and the second inject openings 316 each include apertures. The injector 310 includes a body 317 that is ring-shaped, such as in the shape of a circular ring or a rectangular ring (as shown in FIG. 5). In one or more embodiments, the injector 310 can be referred to as an inject ring.

Figure 11:
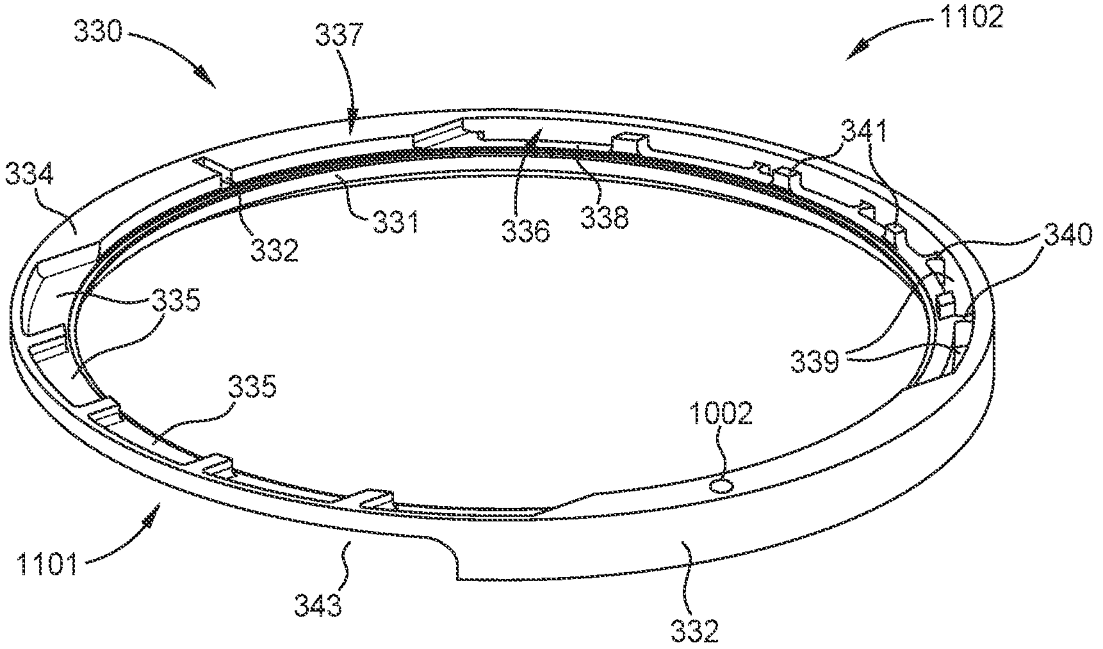
FIG. 11 is a schematic axonometric top view of the first liner shown in FIGS. 1-10, according to one or more implementations.
Figure 12:
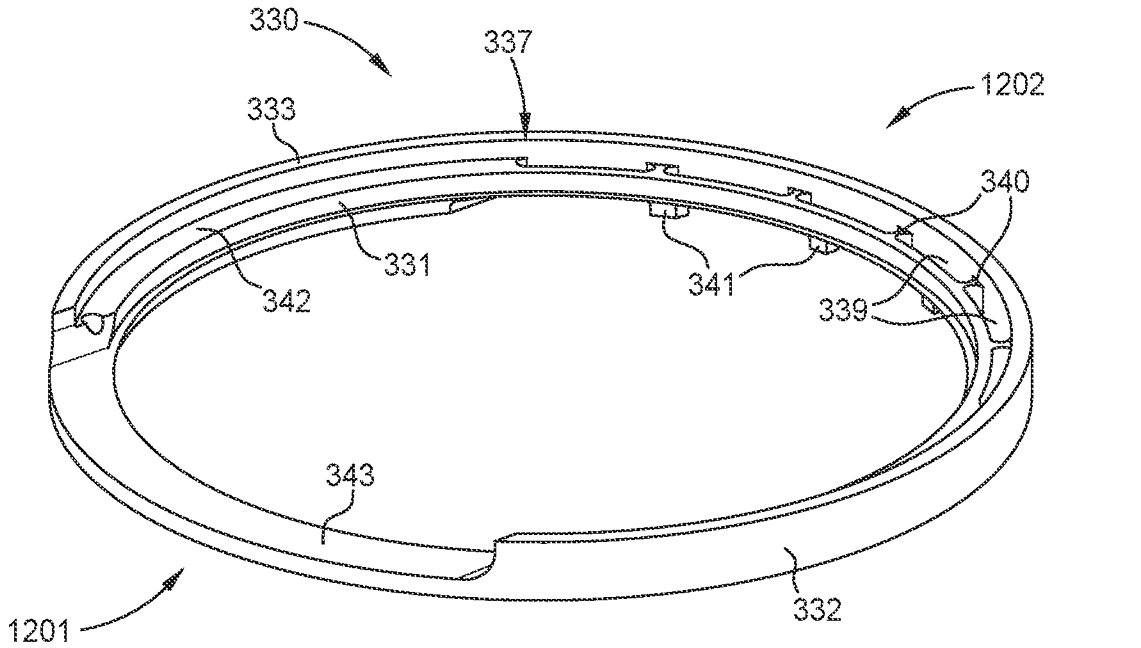
FIG. 12 is a schematic axonometric bottom view of the first liner shown in FIGS. 1-10, according to one or more implementations.

The process kit includes a first liner 330 sized and shaped to be disposed inwardly of the injector 310. The first liner 330 is at least partially supported by the insert 301. The first liner 330 includes an inner face 331 and an outer face 332 opposing the inner face 331 of the first liner 330. The first liner 330 includes a first side face 333 between the inner face 331 of the first liner 330 and the outer face 332 of the first liner 330. The first liner 330 includes a second side face 334 between the inner face 331 of the first liner 330 and the outer face 332 of the first liner 330. The second side face 334 opposes the first side face 333. The first liner 330 includes a plurality of inlet openings 335 on an inlet side of the first liner 330. The plurality of inlet openings 335 extend into the inner face 331 of the first liner 330 and the second side face 334. In one or more embodiments, the inlet openings 335 of the first liner 330 include recesses. The first liner 330 includes a body 337 that is ring-shaped, such as in the shape of a circular ring (as shown in FIGS. 11 and 12) or a rectangular ring.

The process kit includes a second liner 350 that is sized and shaped to be at least partially supported by the first liner 330. The second liner 350 includes an inner face 351 and an outer face 352 opposing the inner face 351 of the second liner 350. The second liner 350 includes a first side face 353 between the inner face 351 of the second liner 350 and the outer face 352 of the second liner 350. The second liner 350 includes a second side face 354 between the inner face 351 of the second liner 350 and the outer face 352 of the second liner 350. The second side face 354 of the second liner 350 opposes the first side face 353 of the second liner 350. The second liner 350 includes a plurality of inlet openings 355 on an inlet side of the second liner 350. The plurality of inlet openings 355 of the second liner 350 extend into the outer face 352 of the second liner 350.

In one or more embodiments, the plurality of inlet openings 355 of the second liner 350 include a first row 361 extending into the first side face 353 of the second liner 350 and configured (e.g., sized, shaped, and positioned along the second liner 350) to align with the first row 314 of the first inject openings 313 of the injector 310. In one or more embodiments, the plurality of inlet openings 355 of the second liner 350 include a second row 362 extending into the second side face 354 of the second liner 350 and configured e.g., sized, shaped, and positioned along the second liner 350) to align with the second row 315 of the first inject openings 313 of the injector 310. In one or more embodiments, the inlet openings 355 that include the first row 361 and the second row 362 are a plurality of first inlet openings, and the second liner 350 includes a plurality of second inlet openings 363 extending between the inner face 351 of the second liner 350 and the outer face 352 of the second liner 350. The first row 361 of the plurality of first inlet openings 355 of the second liner 350 include first recesses extending into the outer face 352 and the first side face 353 of the second liner 350. The second row 362 of the plurality of first inlet openings 355 of the second liner 350 include second recesses extending into the outer face 352 and the second side face 354 of the second liner.

Figure 13:
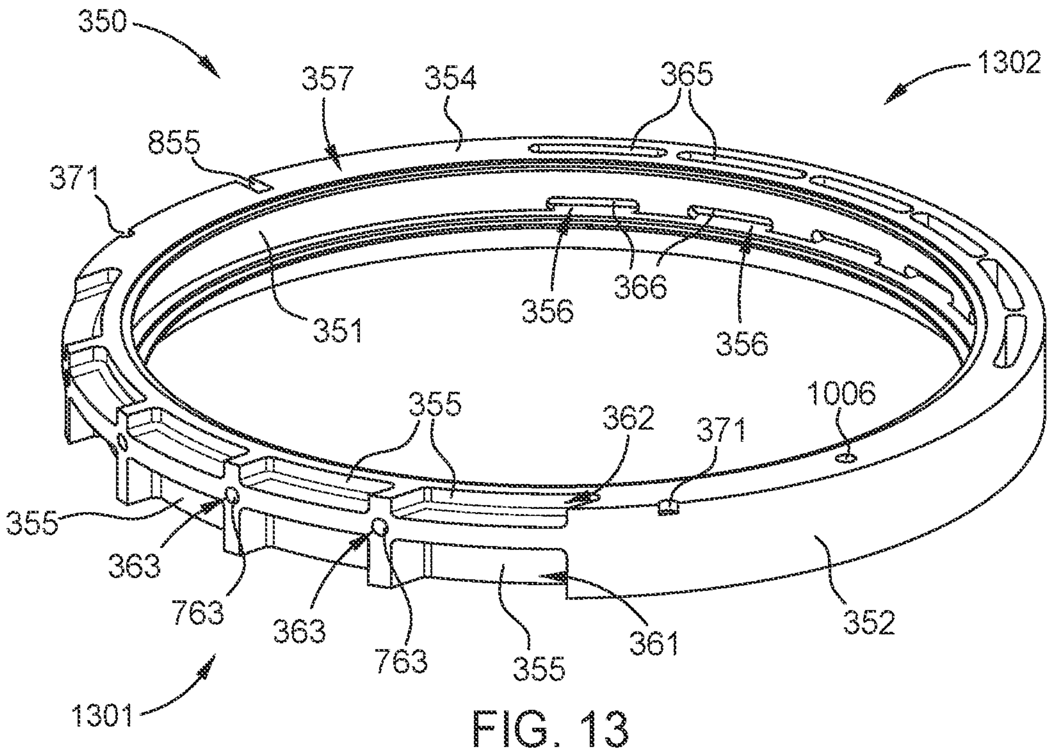
FIG. 13 is a schematic axonometric top view of the second liner shown in FIGS. 1-10, according to one or more implementations.
Figure 14:
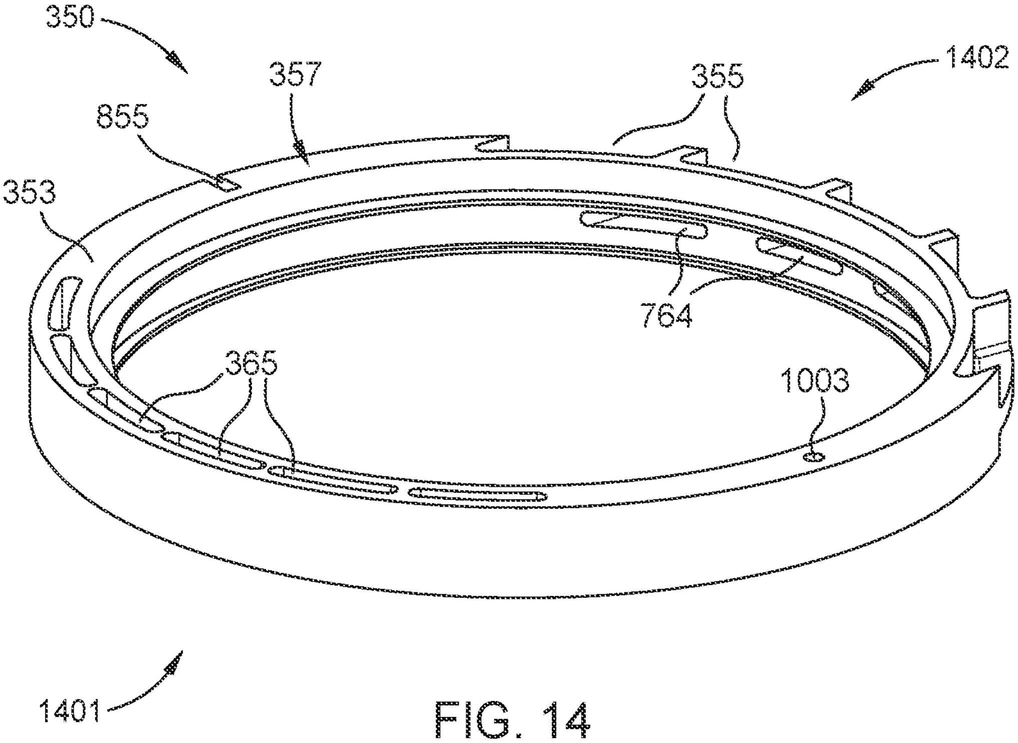
FIG. 14 is a schematic axonometric bottom view of the second liner shown in FIGS. 1-10, according to one or more implementations.

The plurality of second inlet openings 363 of the second liner 350 are configured (e.g., sized, shaped, and positioned along the second liner 350) to align with the second inject openings 316 of the injector 310. The second liner 350 includes a body 357 that is ring-shaped, such as in the shape of a circular ring (as shown in FIGS. 13 and 14) or a rectangular ring.

Figure 15:
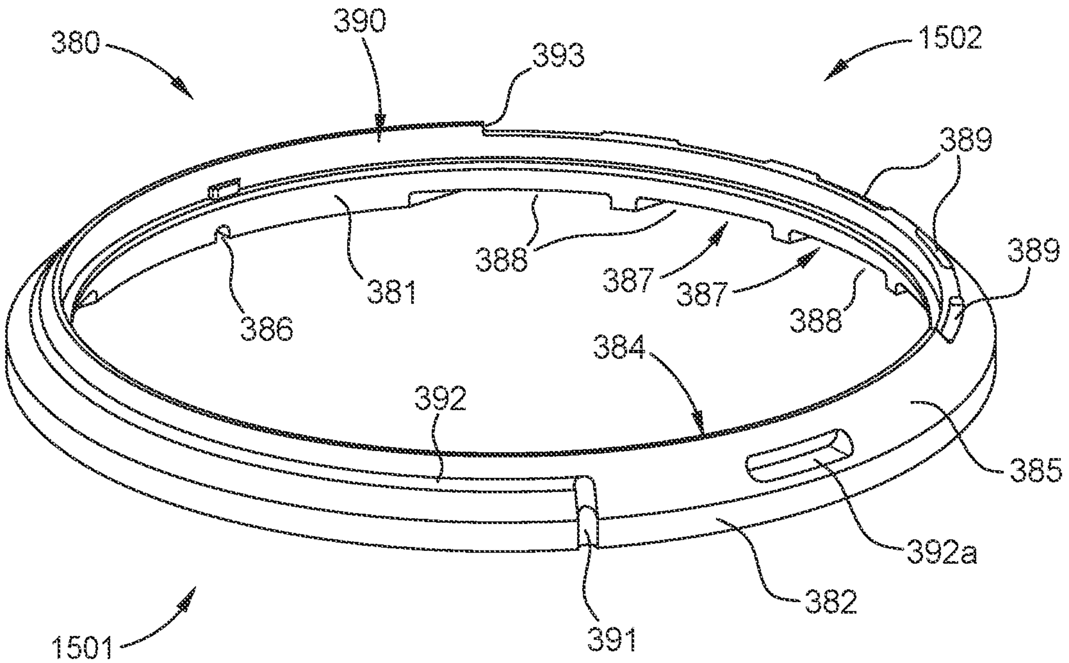
FIG. 15 is a schematic axonometric top view of the third liner shown in FIGS. 1-10, according to one or more implementations.
Figure 16:
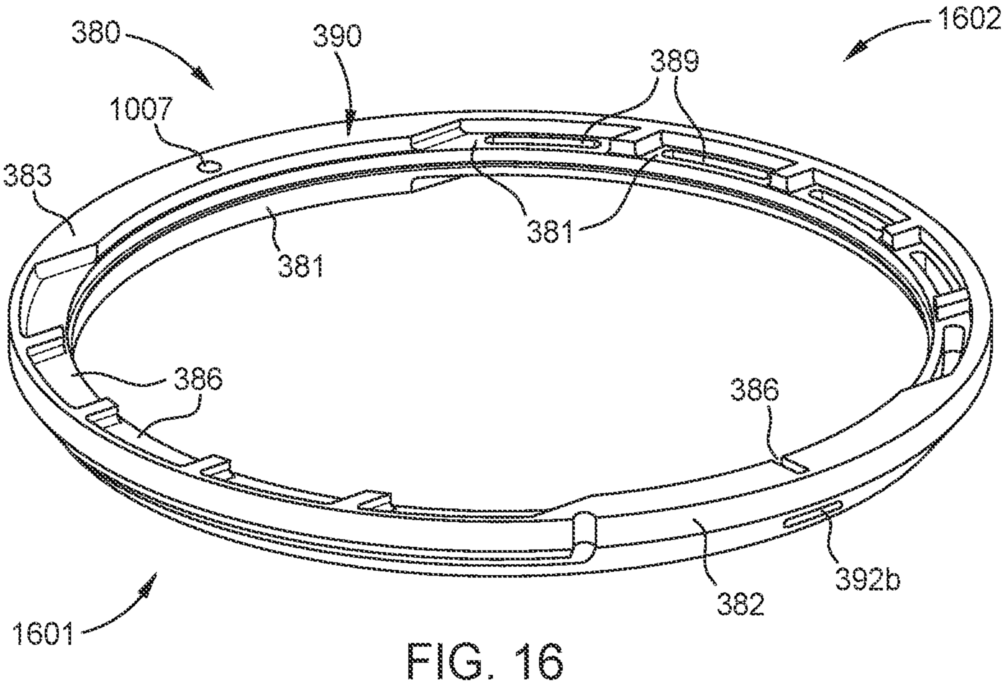
FIG. 16 is a schematic axonometric bottom view of the third liner shown in FIGS. 1-10, according to one or more implementations.

The process kit includes a third liner 380 sized and shaped to be supported at least partially by the second liner 350. The third liner 380 includes an inner face 381 and an outer face 382 opposing the inner face 381 of the third liner 380. The third liner 380 includes a first side face 383 between the inner face 381 of the third liner 380 and the outer face 382 of the third liner 380, and a second side face 384 between the inner face 381 of the third liner 380 and the outer face 382 of the third liner 380. The second side face 384 of the third liner 380 opposes the first side face 383 of the third liner 380. The second side face 384 of the third liner 380 includes a tapered section 385. The third liner 380 includes a plurality of inlet openings 386 on an inlet side of the third liner 380. The plurality of inlet openings 386 of the third liner 380 extend into the first side face 383 of the third liner 380. The plurality of inlet openings 386 of the third liner 380 extend into the inner face 381 of the third liner 380. In one or more embodiments, the plurality of inlet openings 386 of the third liner 380 include recesses. The third liner 380 includes a body 390 that is ring-shaped, such as in the shape of a circular ring (as shown in FIGS. 15 and 16) or a rectangular ring.

The first liner 330, the second liner 350, and the third liner 380 are vertically stacked with respect to each other. In one or more embodiments, inner diameters of the respective liners 330, 350, 380 are substantially equal to each other (such as within a difference of 10% or less). The inner diameters are defined for the respective liners 330, 350, 380 by the respective inner faces 331, 351, 381. In one or more embodiments, outer diameters of the respective liners 330, 350, 380 are substantially equal to each other (such as within a difference of 10% or less). The outer diameters are defined for the respective liners 330, 350, 380 by the respective outer faces 332, 352, 382.

The insert 301 and the base 302 can each include a transfer opening 303, 304 for transferring substrates therethrough. The openings 303, 304 may be used to transfer the substrates 107 to or from the cassette 1030, e.g., in and out of the internal volume 124. In one or more embodiments, the openings 303, 304 include a slit valve. In one or more embodiments, the openings 303, 304 may be connected, interfacing with, or part of to any suitable valve that enables the passage of substrates therethrough. The openings 303, 304 are shown as open, and may be closed (such as by using a door of a slit valve). In one or more embodiments, a first cover 398 covers a cooling channel 397 formed in the injector 310, and a second cover 396 covers cooling channels 394, 395 formed in the injector 310 and the base 302.

Figure 4:
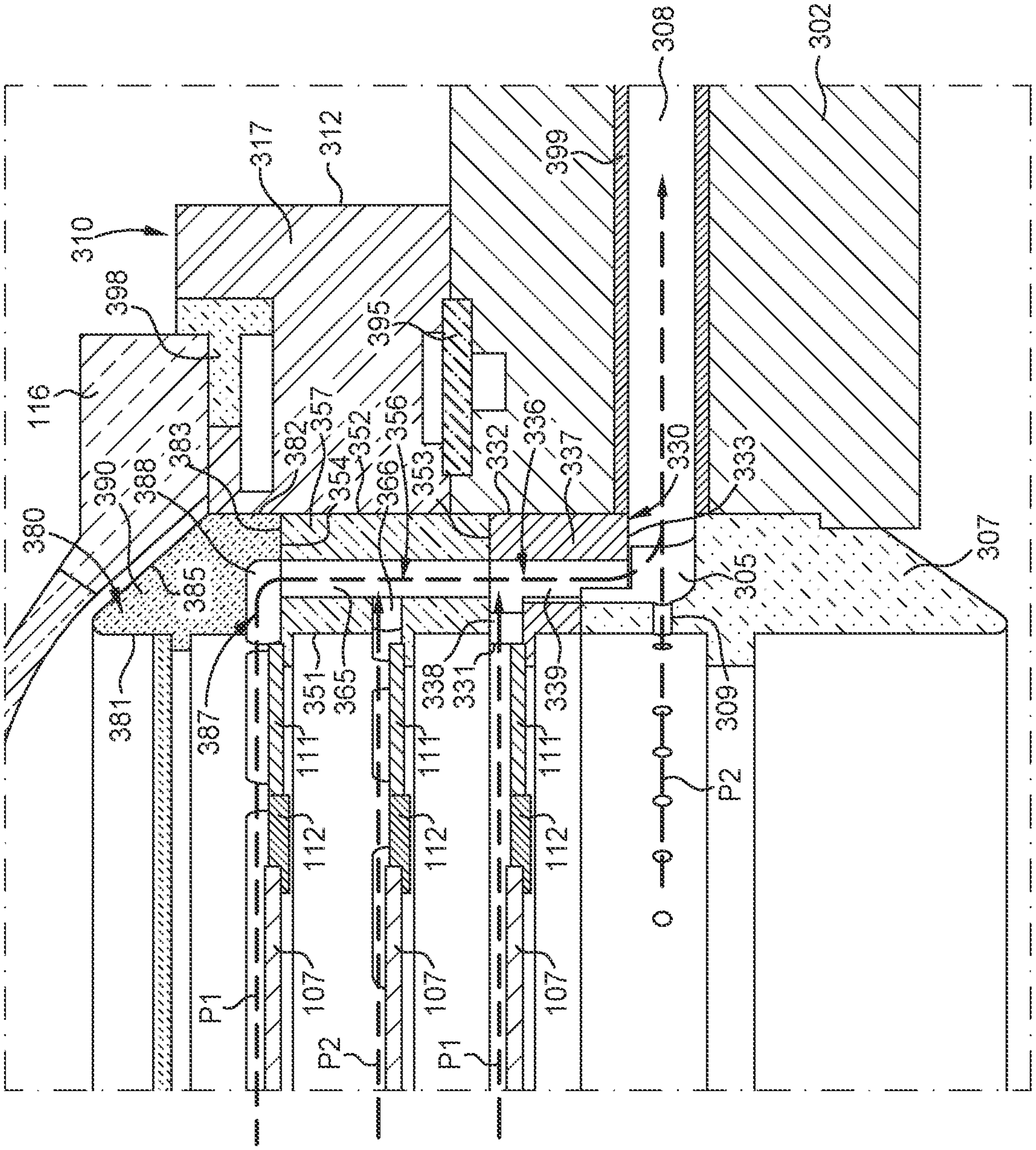
FIG. 4 is a schematic enlarged view of an outlet side of the processing apparatus shown in FIG. 1, according to one or more implementations.

FIG. 4 is a schematic enlarged view of an outlet side of the processing apparatus 100 shown in FIG. 1, according to one or more implementations.

The first liner 330 includes one or more outlet openings 336 on an outlet side of the first liner 330. The outlet side opposes the inlet side. The one or more outlet openings 336 extend into the inner face 331 of the first liner 330. The one or more outlet openings 336 of the first liner 330 include a recess section 338 extending into the inner face 331 of the first liner 330. The one or more outlet openings 336 include a passage section 339 extending into the recess section 338.

The second liner 350 includes one or more outlet openings 356 on an outlet side of the second liner 350. The outlet side of the second liner 350 opposes the inlet side of the second liner 350. The one or more outlet openings 356 of the second liner 350 extend into the inner face 351 of the second liner 350. The one or more outlet openings 356 of the second liner 350 include a passage section 365 extending between the first side face 353 and the second side face 354 of the second liner 350. The one or more outlet openings 356 of the second liner 350 include an aperture section 366 extending between the inner face 351 of the second liner 350 and the passage section 365 of the second liner 350.

The third liner 380 includes one or more outlet openings 387 on an outlet side of the third liner 380. The outlet side of the third liner 380 opposes the inlet side of the third liner 380. The one or more outlet openings 387 of the third liner 380 extend into the inner face 381 of the third liner 380. The one or more outlet openings 387 of the third liner 380 extend into the first side face 383 of the third liner 380. In one or more embodiments, the one or more outlet openings 387 of the third liner 380 include a recess section 388 extending into the inner face 381 and the first side face 383 of the third liner 380.

The insert 301 and the base 302 can each include a transfer opening 303, 304 for transferring substrates therethrough. The openings 303, 304 may be used to transfer the substrates 107 to or from the cassette 1030, e.g., in and out of the internal volume 124. In one or more embodiments, the openings 303, 304 include a slit valve. In one or more embodiments, the openings 303, 304 may be connected, interfacing with, or part of to any suitable valve that enables the passage of substrates therethrough.

During operations (such as during an epitaxial deposition operation), a first gas flow P1 is supplied to the processing volume 128 through an outer supply conduit system 122 and a second gas flow P2 is supplied to the processing volume 128 through an inner supply conduit system 121. The first gas flow P1 includes one or more process gases and the second gas flow P2 includes one or more purge gases. The inner and outer supply conduit systems 121, 122 include a plurality of gas boxes 117 mounted to the injector 310. The present disclosure contemplates that a variety of supply conduit system(s) and/or gas boxes may be used.

The first gas flow P1 is supplied from one or more gas sources 196 through one or more valves 183 (shown in FIG. 1), and the second gas flow P2 is supplied from one or more purge gas sources 129 through one or more valves 182.

The inlet openings 335, the second inlet openings 363, and the inlet openings 386 are configured to direct the first gas flow P1 and the second gas flow P2 in a generally radially inward direction towards the cassette 1030. The flow(s) of the one or more process gases P1 can be divided into the plurality of flow levels 153. In one or more embodiments, the plate 109 separates the processing volume 128 from an upper section 131 of the internal volume 124. For at least the uppermost flow level 153 (or a single flow level 153—if a single flow level 153 is used), the one or more process gases P1 can be guided (using the plate 109) along a streamlined flow path such that diversive flow away from the uppermost substrate 107 (or a single substrate 107—if a single substrate 107 is used) is reduced or eliminated. The plate assembly 300 can facilitate a more uniform flow of the one or more process gases P1 along the uppermost flow level 153 relative to the other flow levels 153 below the uppermost flow level 153.

The processing apparatus 100 includes a common exhaust box 1092 (shown in FIG. 1). The first gas flow P1 and the second gas flow P2 flow out of the internal volume 124, through the liners 307, 330, 350, 380, and through one or more exhaust passages 308. The first gas flow P1 and the second gas flow P2 flow from the one or more exhaust passages 308 and through the common exhaust box 1092 using one or more pump devices 197 (such as one or more vacuum pumps) shown in FIG. 1. The one or more exhaust passages 308 are defined at least partially by one or more exhaust structures 399 (e.g., boxes) in fluid communication with the common exhaust box 1092.

The one or more processing gases of the first gas flow P1 can include, for example, purge gases, cleaning gases, and/or deposition gases. The deposition gases can include, for example, one or more reactive gases carried in one or more carrier gases. The one or more reactive gases can include, for example, silicon and/or germanium containing gases (such as silane ($SiH_4$), disilane ($Si_2H_6$), dichlorosilane ($SiH_2Cl_2$), and/or germane ($GeH_4$)), chlorine containing etching gases (such as hydrogen chloride (HCl)), and/or dopant gases (such as phosphine ($PH_3$) and/or diborane ($B_2H_6$)). The one or more purge gases of the first gas flow P1 and/or the second gas flow P2 can include, for example, one or more of argon (Ar), helium (He), nitrogen ($N_2$), hydrogen chloride (HCl), and/or hydrogen ($H_2$).

The second gas flow P2 can be supplied to the processing volume 128 through the second liner 350 and also supplied to a bottom region 105 (shown in FIG. 1) of the internal volume 124 through one or more purge gas inlets formed in the one or more sidewalls of the chamber body 130 (e.g., formed below or circumferentially outwardly of the insert 301) that direct the second gas flow P2 in a generally radially inward direction. The one or more purge gases of the second gas flow P2 can be supplied from a purge gas source 129 (shown in FIG. 1). The second gas flow P2 in the bottom region 105 can be directed in an upward direction. During a film formation process, the substrate support assembly 119 is located at a position that can facilitate the second gas flow P2 in the bottom region 105 to flow generally along a flow path across a back side of the cassette 1030. The second gas flow in the bottom region 105 exits the bottom region 105 through one or more purge gas outlets 309 formed in a lower liner 307, through one or more exhaust channels 305 of the lower liner 307, and through the one or more exhaust passages 308.

In the implementation shown in FIGS. 3 and 4, the cassette 1030 includes three substrate supports 112, three flow dividers 111, and three substrates 107. In one or embodiments, the first gas flow P1 supplied from the first liner 330 flows over an upper surface of a first substrate (the lower substrate 107), the second gas flow P2 supplied from the second liner 350 flows over an upper surface of a second substrate (the middle substrate 107), and the first gas flow P1 supplied from the third liner 380 flows over an upper surface of a third substrate (the upper substrate 107). In such an embodiment, the upper surface of the first substrate 107 (the lower substrate 107) and the upper surface of the third substrate 107 (the upper substrate 107) are processed by the first gas flow P1 (e.g., for deposition) while the upper surface of the second substrate 107 (the middle substrate 107) is purged by the second gas flow P2. The second substrate 107 (the middle substrate 107) functions as a barrier between the first substrate 107 (the lower substrate 107) and the third substrate 107 (the upper substrate 107). The present disclosure contemplates that other barriers may be used in place of the second substrate 107 (the middle substrate 107). The processing apparatus 100 facilitates modularity in gas flow paths to reduced or eliminate contamination of the barrier (e.g., the second substrate 107). For example, the second gas flow P2 can be supplied to the second flow level 153 while the first gas flow P1 is supplied to the first and third flow levels 153 and while the window gas flow WP1 is supplied to the upper section 131.

In the implementation shown in FIGS. 3 and 4, the first liner 330 includes a ledge 349 that supports a first flow divider 111 (the lower flow divider 111), and the second liner 350 includes two ledges 378, 379 that respectively support a second flow divider 111 (the middle flow divider 111) and a third flow divider 111 (the upper flow divider 111). The third liner 380 includes a ledge 377 that supports the plate 109.

FIG. 5 is a schematic partial top view of the processing apparatus 100 shown in FIG. 1, according to one or more implementations. The section shown in FIG. 1 is taken approximately along Section 1-1 shown in FIG. 5. The section shown in FIG. 2 is taken approximately along Section 2-2 shown in FIG. 5.

Figure 6:
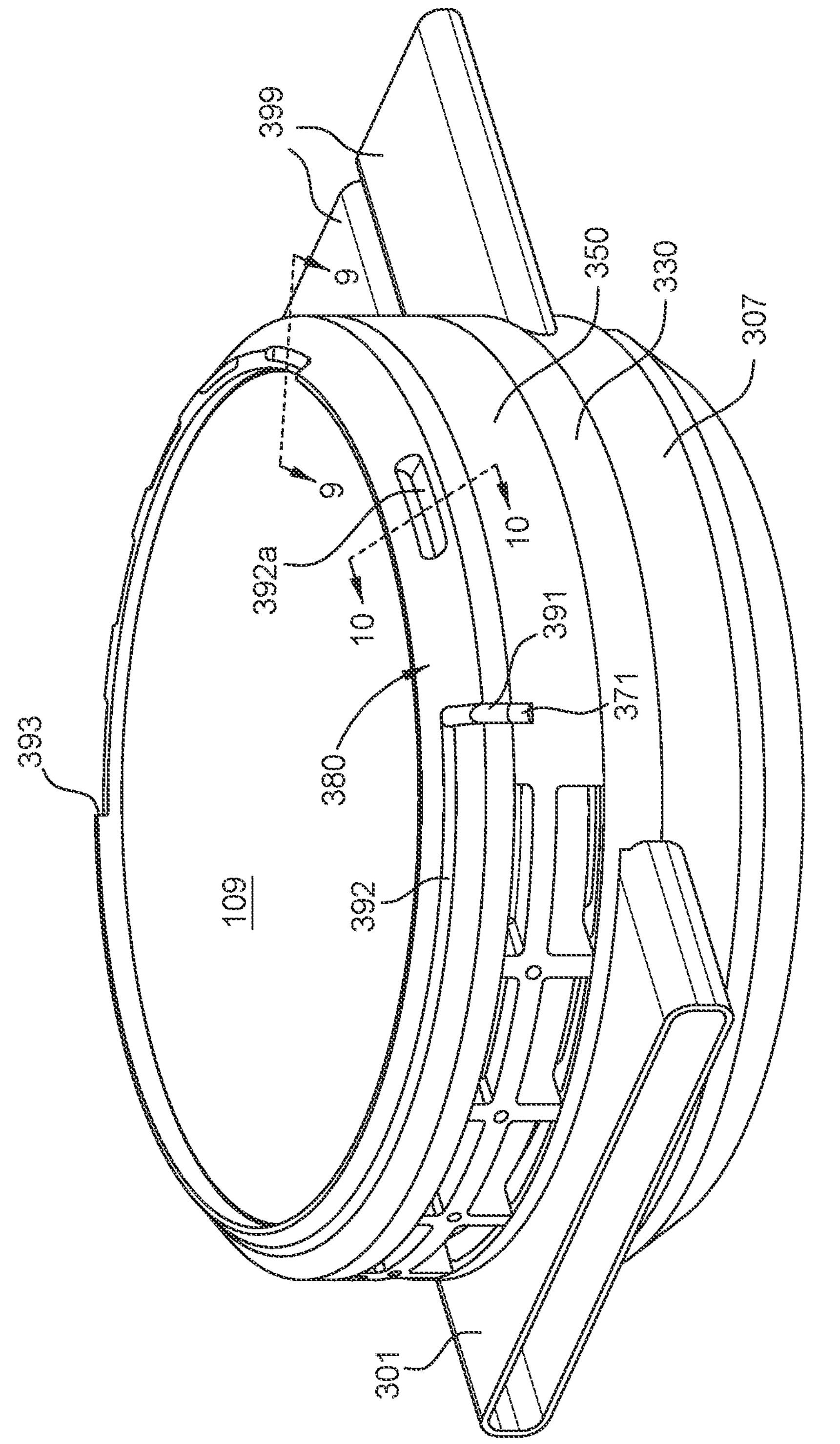
FIG. 6 is a schematic partial axonometric view of the inlet side of the processing apparatus shown in FIG. 1, according to one or more implementations.

FIG. 6 is a schematic partial axonometric view of the inlet side of the processing apparatus 100 shown in FIG. 1, according to one or more implementations.

The second liner 350 includes one or more outward inlet openings 371 (two are shown in FIG. 13 below) extending into the second side face 354. The one or more outward inlet openings 371 are disposed circumferentially outwardly of the inlet openings 355.

The third liner 380 includes one or more second inlet openings 391 (two are shown in FIG. 16 below) extending between the first side face 383 and the tapered section 385 of the second side face 384 of the third liner 380. The one or more second inlet openings 391 are disposed circumferentially outwardly of the inlet openings 386. An arcuate channel 392 is disposed between the two second inlet openings 391. The arcuate channel 392 extends into the tapered section 385.

A window gas flow WP1 (shown in FIG. 3) is supplied to the upper section 131 through the one or more second inlet openings 391 and/or the arcuate channel 392. The window gas flow WP1 includes one or more purge gases (such as the same or different purge gases as the second gas flow P2). The window gas flow WP1 flows from the injector 310 and to the one or more second inlet openings 391, and then flows to the one or more second inlet openings 391 of the third liner 380. The gas flows through the one or more second inlet openings 391 and into the arcuate channel 392 and/or into the upper section 131.

Figure 7:
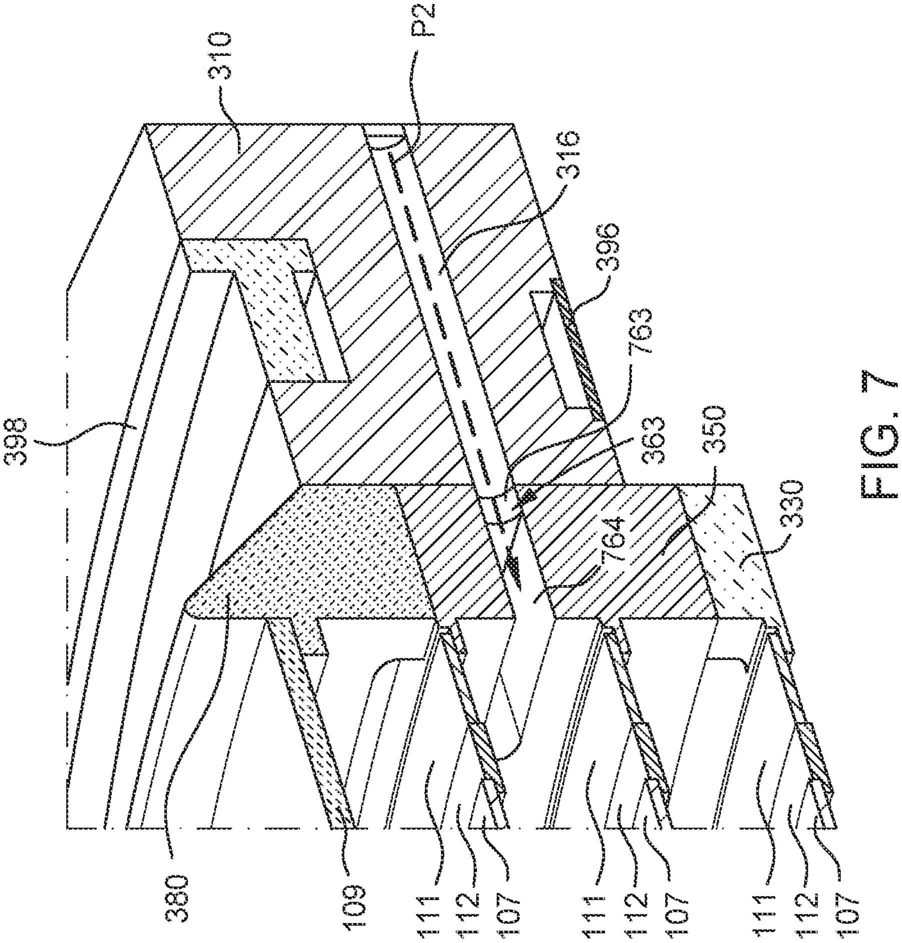
FIG. 7 is a schematic partial axonometric cross-sectional view of the inlet side of the processing apparatus shown in FIG. 1, according to one or more implementations.

FIG. 7 is a schematic partial axonometric cross-sectional view of the inlet side of the processing apparatus 100 shown in FIG. 1, according to one or more implementations. The section shown in FIG. 7 is taken approximately along Section 7-7 shown in FIG. 5. The second inlet openings 363 include an aperture section 763 that extends between the outer face 352 and a recess section 764 that extends into the inner face 351.

Figure 8:
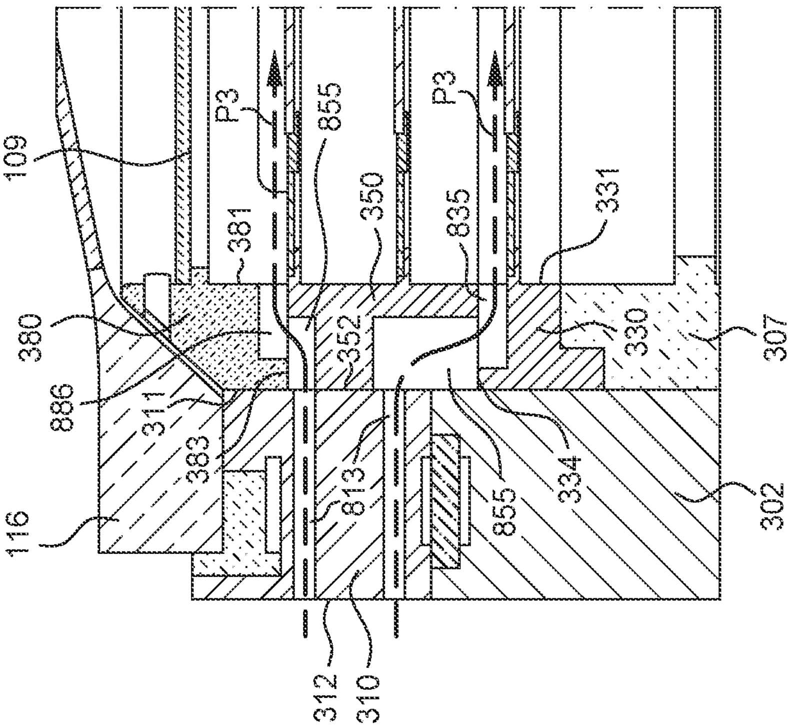
FIG. 8 is a schematic partial side cross-sectional view of a cross-flow side of the processing apparatus shown in FIG. 1, according to one or more implementations.

FIG. 8 is a schematic partial side cross-sectional view of a cross-flow side of the processing apparatus 100 shown in FIG. 1, according to one or more implementations. The section shown in FIG. 8 is taken approximately along Section 8-8 shown in FIG. 5.

The injector 310 includes a plurality of side inject openings 813 (including a first row, e.g., a lower row, of one or more side inject openings 813 and a second row, e.g., an upper row, of one or more side inject openings 813) extending between the inner face 311 and the outer face 312. In one or more embodiments, the side inject openings 813 include apertures. The side inject openings 813 are in fluid communication with (e.g., using one or more conduits) one or more gas sources (such as the one or more gas sources 196).

The first liner 330 includes one or more side inlet openings 835 on a cross-flow side of the first liner 330. The one or more side inlet openings 835 extend into the inner face 331 of the first liner 330 and the second side face 334. In one or more embodiments, the one or more side inlet openings 835 of the first liner 330 include recesses. In one or more embodiments, the one or more side inlet openings 835 include one or more recesses.

The second liner 350 includes a plurality of side inlet openings 855 on a cross-flow side of the second liner 350. The plurality of side inlet openings 855 of the second liner 350 extend into the outer face 352 of the second liner 350. In one or more embodiments, the side inlet openings 855 include recesses.

The third liner 380 includes one or more side inlet openings 886 on a cross-flow side of the third liner 380. The one or more side inlet openings 886 of the third liner 380 extend into the first side face 383 of the third liner 380. The one or more side inlet openings 886 of the third liner 380 extend into the inner face 381 of the third liner 380. In one or more embodiments, the one or more side inlet openings 886 of the third liner 380 include recesses.

A third gas flow P3 is supplied to the side inject openings 813, flows through the side inlet openings 855, and respectively through the one or more side inlet openings 835 and the one or more side inlet openings 886. The third gas flow P3 then flows into the processing volume 128 at a cross-flow relative to the first gas flow P1. The third gas flow P3 includes one or more process gases (such as the same or different process gas(es) as the first gas flow P1) to provide a cross-flow relative to the first gas flow P1.

Figure 9:
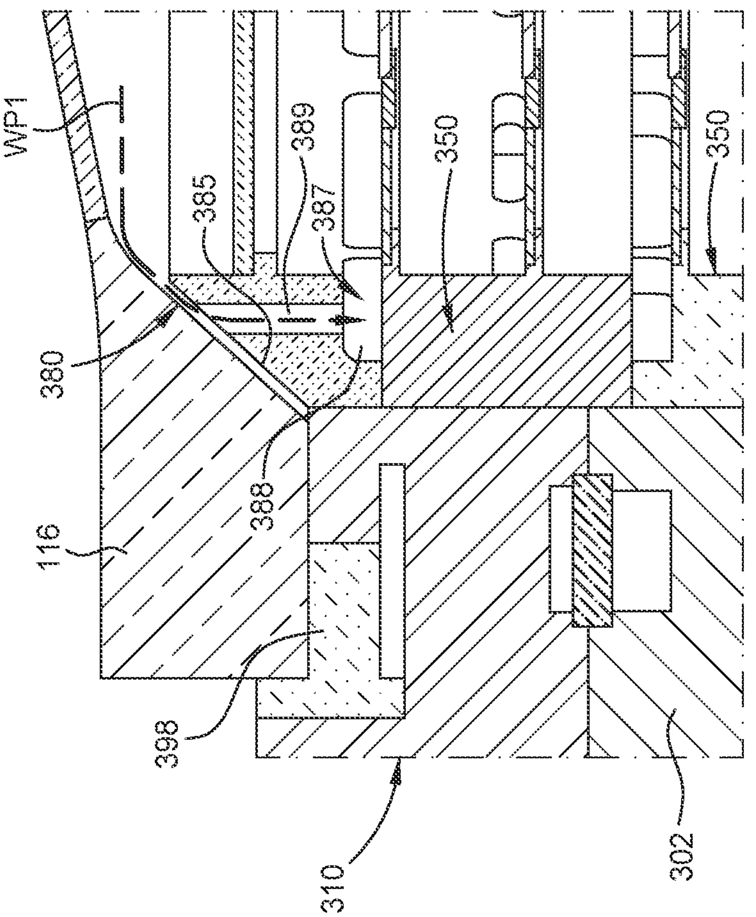
FIG. 9 is a schematic partial side cross-sectional view of a cross-flow side of the processing apparatus shown in FIG. 1, according to one or more implementations.

FIG. 9 is a schematic partial side cross-sectional view of a cross-flow side of the processing apparatus 100 shown in FIG. 1, according to one or more implementations. The section shown in FIG. 8 is taken approximately along Section 8-8 shown in FIG. 5. The one or more outlet openings 387 of the third liner 380 include a passage section 389 extending between the recess section 388 and the tapered section 385.

Figure 10:
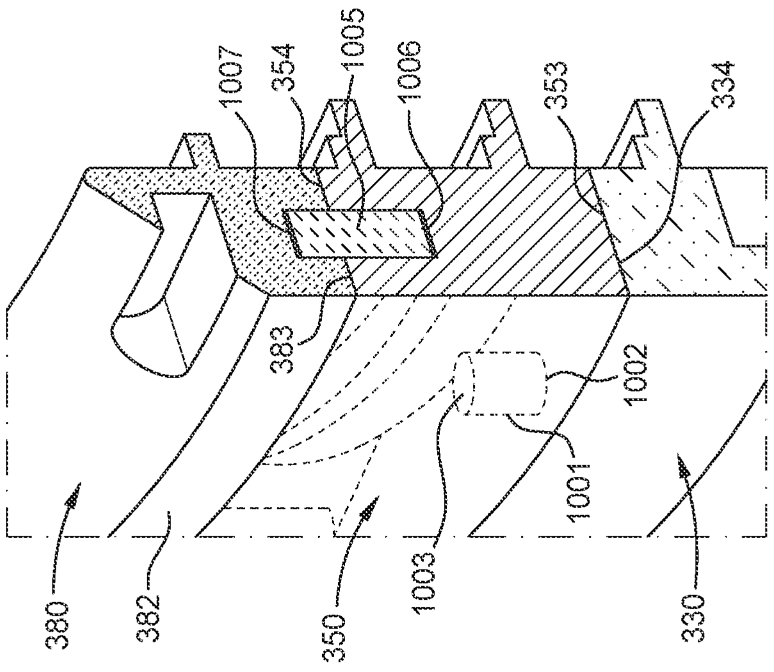
FIG. 10 is a schematic partial axonometric cross-sectional view of the processing apparatus shown in FIG. 1, according to one or more implementations.

FIG. 10 is a schematic partial axonometric cross-sectional view of the processing apparatus 100 shown in FIG. 1, according to one or more implementations. The section shown in FIG. 10 is taken approximately along Section 10-10 shown in FIG. 6. A first alignment pin 1001 is disposed between the first liner 330 and the second liner 350. The first alignment pin 1001 facilitates alignment of the first liner 330 and the second liner 350 with each other, and facilitates reducing or preventing relative rotation between the first liner 330 and the second liner 350. The first alignment pin 1001 is disposed in a retention opening 1002 formed in the second side face 334 of the first liner 330 and a retention opening 1003 formed in the first side face 353 of the second liner 350.

A second alignment pin 1005 is disposed between the second liner 350 and the third liner 380. The second alignment pin 1005 facilitates alignment of the second liner 350 and the third liner 380 with each other, and facilitates reducing or preventing relative rotation between the second liner 350 and the third liner 380. The second alignment pin 1005 is disposed in a retention opening 1006 formed in the second side face 354 of the second liner 350 and a retention opening 1007 formed in the first side face 383 of the third liner 380. In one or more embodiments, the first and second alignments pins 1001, 1005 are formed of quartz.

The second liner 350 is partially shown in ghost in FIG. 10 for visual clarity purposes.

FIG. 11 is a schematic axonometric top view of the first liner 330 shown in FIGS. 1-10, according to one or more implementations. In the view shown in FIG. 11, the inlet side of the first liner 330 is at a front 1101 of the view and the outlet side of the first liner 330 is at a back 1102 of the view.

FIG. 12 is a schematic axonometric bottom view of the first liner 330 shown in FIGS. 1-10, according to one or more implementations. In the view shown in FIG. 12, the inlet side of the first liner 330 is at a front 1201 of the view and the outlet side of the first liner 330 is at a back 1202 of the view.

A plurality of passage sections 339 are shown in FIGS. 11 and 12, and the passage sections 339 are separated by beams 340. A plurality of protrusions 341 protrude to separate portions of the recess section 338. In one or more embodiments, upper surfaces of the protrusions 341 are part of the second side face 334. The first liner 330 includes a second recess section 342 extending into the inner face 331 and the first side face 333. The passage sections 339 extend between the recess section 338 and the second recess section 342. The first liner 330 includes a recess 343 formed on the inlet side such that the insert 301 can extend at least partially therethrough.

FIG. 13 is a schematic axonometric top view of the second liner 350 shown in FIGS. 1-10, according to one or more implementations. In the view shown in FIG. 13, the inlet side of the second liner 350 is at a front 1301 of the view and the outlet side of the second liner 350 is at a back 1302 of the view.

As shown in FIG. 13, the plurality of second inlet openings 363 of the second liner are aligned at least partially between columns of the first inlet openings 355 of the second liner 350.

FIG. 14 is a schematic axonometric bottom view of the second liner 350 shown in FIGS. 1-10, according to one or more implementations. In the view shown in FIG. 14, the outlet side of the second liner 350 is at a front 1401 of the view and the inlet side of the second liner 350 is at a back 1402 of the view.

FIG. 15 is a schematic axonometric top view of the third liner 380 shown in FIGS. 1-10, according to one or more implementations. In the view shown in FIG. 15, the inlet side of the third liner 380 is at a front 1501 of the view and the outlet side of the third liner 380 is at a back 1502 of the view.

FIG. 16 is a schematic axonometric bottom view of the third liner 380 shown in FIGS. 1-10, according to one or more implementations. In the view shown in FIG. 16, the inlet side of the third liner 380 is at a front 1601 of the view and the outlet side of the third liner 380 is at a back 1602 of the view.

The third liner 380 includes one or more handling openings 392*a*, 392*b* (two are shown) formed in the tapered section 385. The one or more handling openings 392*a*, 392*b* can be manipulated (e.g., using a user's hands and/or by using a tool and/or a robot) to lift, lower, and otherwise position the third liner 380. The third liner 380 includes an outlet side slot 393 extending into the second side face 384.

Figure 17:
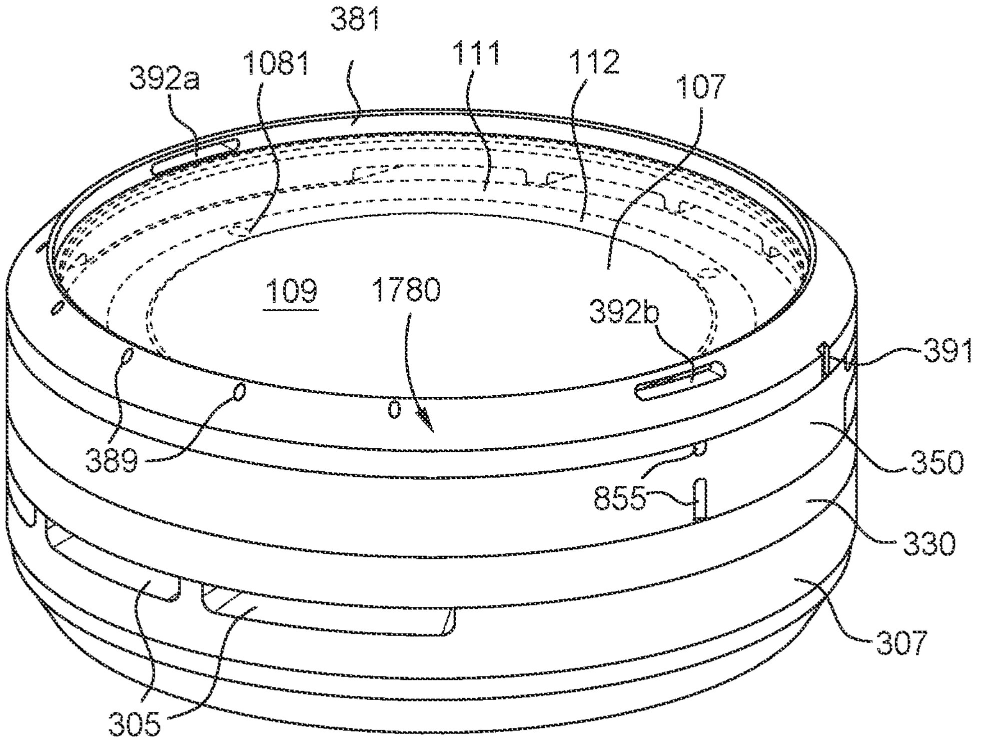
FIG. 17 is a schematic partial axonometric view of the outlet side of the processing apparatus shown in FIG. 1, according to one or more implementations.

FIG. 17 is a schematic partial axonometric view of the outlet side of the processing apparatus 100 shown in FIG. 1, according to one or more implementations.

In the implementation shown in FIG. 17, the outlet side slot 393 is omitted, and the passage sections 389 are circular in shape (a slot shape is shown in FIGS. 15 and 16). In the implementation shown in FIG. 17, the arcuate channel 392 is omitted, the one or more outward inlet openings 371 are omitted, and the one or more handling openings 392*a*, 392*b* extend to the inner face 381.

Figure 18:
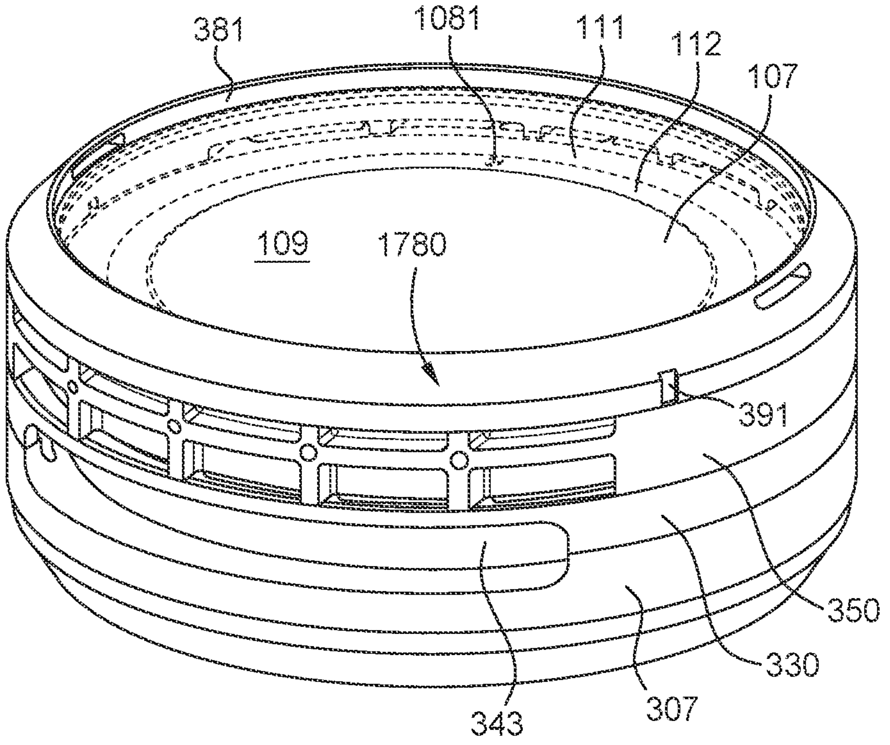
FIG. 18 is a schematic partial axonometric view of the inlet side of the processing apparatus shown in FIG. 17, according to one or more implementations.

FIG. 18 is a schematic partial axonometric view of the inlet side of the processing apparatus 100 shown in FIG. 17, according to one or more implementations.

Figure 19:
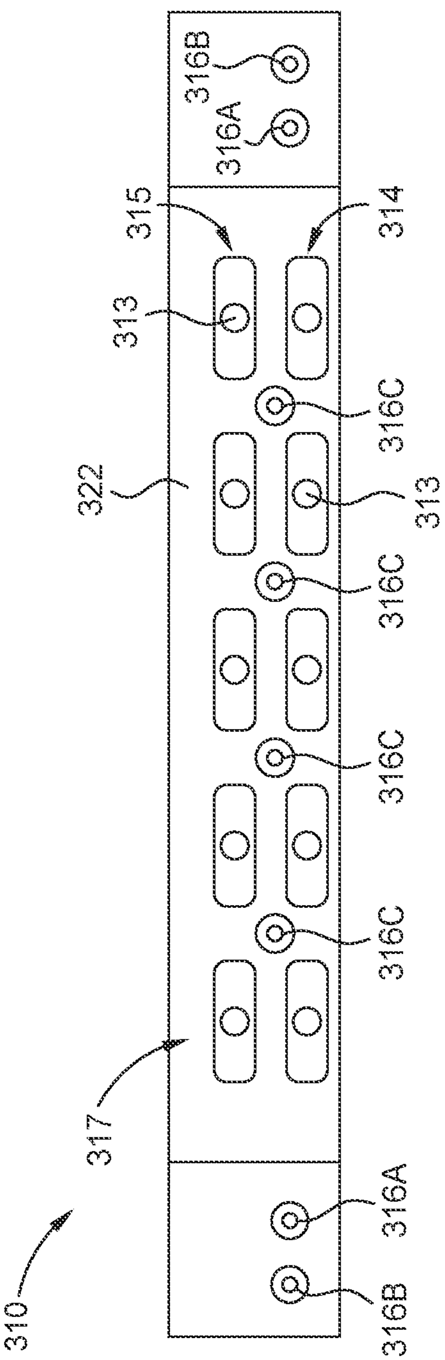
FIG. 19 is a schematic partial front view of the injector shown in FIG. 5, according to one or more implementations.

FIG. 19 is a schematic partial front view of the injector 310 shown in FIG. 5, according to one or more implementations.

The plurality of first inject openings 313 (arranged in the first row 314 and the second row 315) are arranged in five columns, as shown in FIG. 19. In one or more embodiments, at least one—such as at least some—(shown as numerals 316C in FIGS. 5 and 19, having four columns) of the plurality of second inject openings 316 is aligned at least partially between the columns of the first inject openings 313. In one or more embodiments, at least one—such as at least some—(shown as numerals 316A in FIGS. 5 and 19) of the plurality of second inject openings 316 of the injector 310 is aligned circumferentially outwardly of the first inject openings 313. In one or more embodiments, at least one—such as at least some—(shown as numerals 316B in FIGS. 5 and 19) of the plurality of second inject openings 316 of the injector 310 is oriented upwardly to supply the window gas flow WP1 to the outward inlet openings 371 and/or the second inlet openings 391.

The subject matter described herein facilitates providing a plurality of zones for gas flow that can be independently controlled and adjusted for processing uniformity. As an example, the first row 314 of first inject openings 313 facilitate five zones of gas flow for the first gas flow P1 supplied to the first (e.g., lower) flow level 153 such that the first gas flow P1 has five zones of gas flowing over the first (e.g., lower) substrate 107 aligning with the first flow level 153. As another example, the second row 315 of first inject openings 313 facilitate five zones of gas flow for the first gas flow P1 supplied to the third (e.g., upper) flow level 153. As another example, the second inject openings 316C facilitate four zones of gas flow for the second gas flow P2 supplied to the second (e.g., middle) flow level 153. The zones can be independently adjusted and controlled to facilitate uniformity of processing parameters.

Figure 20:
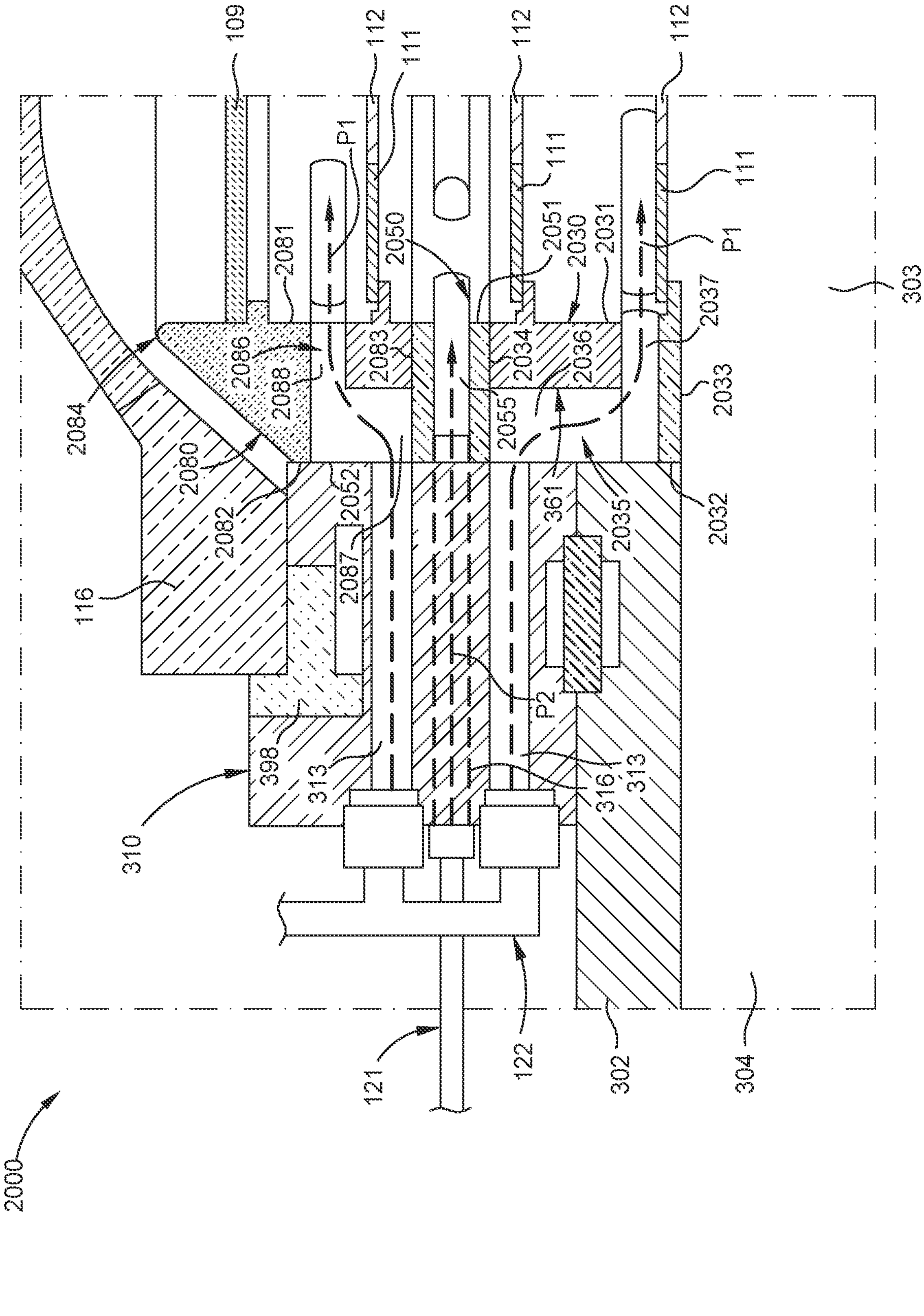
FIG. 20 is a schematic enlarged view of an inlet side of a processing apparatus, according to one or more implementations.

FIG. 20 is a schematic enlarged view of an inlet side of a processing apparatus 2000, according to one or more implementations. The processing apparatus 2000 is similar to the processing apparatus 100 shown in FIGS. 1-3, and includes one or more aspects, features, components, properties, and/or operations thereof.

A process kit of the processing apparatus 2000 includes the injector 310, a first liner 2030, a second liner 2050, and a third liner 2080.

The first liner 2030 includes an inner face 2031, an outer face 2032, a first side face 2033, and a second side face 2034. The first liner 2030 includes a plurality of inlet openings 2035 on an inlet side of the first liner 2030. The plurality of inlet openings 2035 extend into the inner face 2031 of the first liner 2030 and the second side face 2034. In one or more embodiments, the inlet openings 2035 of the first liner 2030 include recess sections 2036 extending into the outer face 2032 and aperture sections 2037 extending between the recess sections 2036 and the inner face 2031. The inlet openings 2035 of the first liner 2030 align with the first inject openings 313 of the first row 314.

The second liner 2050 includes an inner face 2051, an outer face 2052, and a plurality of inlet openings 2055 on an inlet side of the second liner 2050. The plurality of inlet openings 2055 of the second liner 2050 extend between the outer face 2052 and the inner face 2051 of the second liner 350. The inlet openings 2055 align with the second inject openings 316 of the injector 310. In one or more embodiments, the inlet openings 2055 include apertures.

The third liner 2080 includes an inner face 2081, an outer face 2082, a first side face 2083, a second side face 2084, and a plurality of inlet openings 2086 on an inlet side of the third liner 2080. The plurality of inlet openings 2086 of the third liner 380 extend into the first side face 2083 of the third liner 2080. The plurality of inlet openings 2086 of the third liner 380 extend into the inner face 2081 of the third liner 380. In one or more embodiments, the plurality of inlet openings 2086 of the third liner 2080 include recess sections 2087 extending into the outer face 2082 and the first side face 2083, and aperture sections 2088 extending between the recess sections 2087 and the inner face 2081. The inlet openings 2086 of the third liner 2080 align with the first inject openings 313 of the second row 315.

Figure 21:
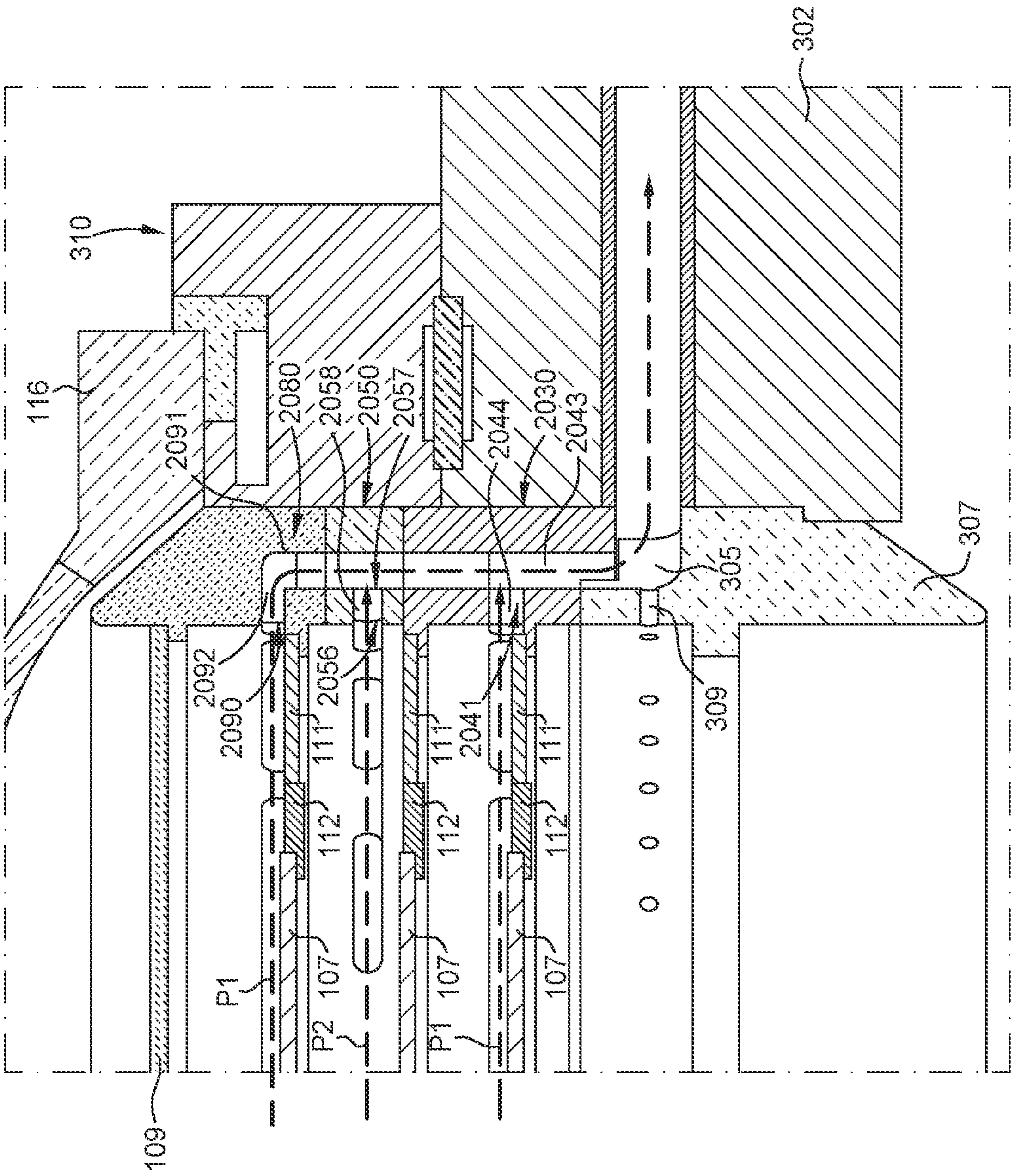
FIG. 21 is a schematic enlarged view of an outlet side of the processing apparatus shown in FIG. 20, according to one or more implementations.

FIG. 21 is a schematic enlarged view of an outlet side of the processing apparatus 2000 shown in FIG. 20, according to one or more implementations.

The first liner 2030 includes one or more outlet openings 2041 on an outlet side of the first liner 2030. In one or more embodiments, the one or more outlet openings 2041 include one or more passage sections 2043 (a single combined passage section 2043 is shown in FIG. 21) extending between the first side face 2033 and the second side face 2034, and a plurality of aperture sections 2044 extending between the inner face 2031 and the one or more passage sections 2043.

The second liner 2050 includes one or more outlet openings 2056 on an outlet side of the second liner 2050. In one or more embodiments, the one or more outlet openings 2056 include one or more passage sections 2057 (a single combined passage section 2057 is shown in FIG. 21) extending between the first side face 2053 and the second side face 2054, and a plurality of aperture sections 2058 extending between the inner face 2051 and the one or more passage sections 2057.

The third liner 2080 includes one or more outlet openings 2090 on an outlet side of the third liner 2080. In one or more embodiments, the one or more outlet openings 2090 include one or more recess sections 2091 (a single combined recess section 2091 is shown in FIG. 21) extending into the first side face 2083, and a plurality of aperture sections 2092 extending between the inner face 2081 and the one or more recess sections 2091.

Figure 22:
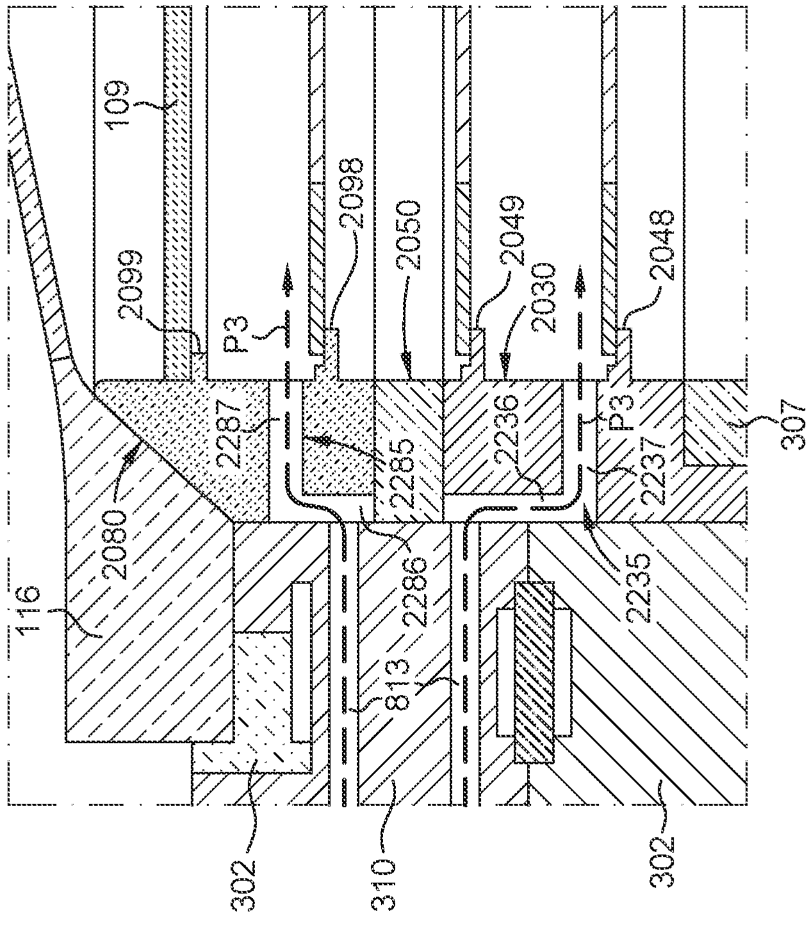
FIG. 22 is a schematic partial side cross-sectional view of a cross-flow side of the processing apparatus shown in FIGS. 20 and 21, according to one or more implementations.

FIG. 22 is a schematic partial side cross-sectional view of a cross-flow side of the processing apparatus 2000 shown in FIGS. 20 and 21, according to one or more implementations.

The first liner 2030 includes one or more side inlet openings 2235 on a cross-flow side of the first liner 2030. In one or more embodiments, the one or more side inlet openings 2235 include one or more recess sections 2236 extending into the second side face 2034 and the outer face 2032, and one or aperture sections 2237 extending between the one or more recess sections 2236 and the inner face 2031.

The third liner 2080 includes one or more side inlet openings 2285 on a cross-flow side of the third liner 2080. The one or more side inlet openings 2285 of the third liner 2080 extend into the first side face 2083 of the third liner 2080. In one or more embodiments, the one or more side inlet openings 2285 include one or more recess sections 2286 extending into the first side face 2083 and the outer face 2082, and one or aperture sections 2287 extending between the one or more recess sections 2286 and the inner face 2081.

The second liner 2050 fluidly separates the third gas flow P3 in the one or more side inlet openings 2235 from the third gas flow P3 in the one or more side inlet openings 2285.

In the implementation shown in FIGS. 20-22, the first liner 2030 includes two ledges 2048, 2049 that respectively support the first flow divider 111 (the lower flow divider 111) and the second flow divider 111 (the middle flow divider 111). The third liner 2080 includes two ledges 2098, 2099 that respectively support the third flow divider 111 (the upper flow divider 111) and the plate 109.

Figure 23:
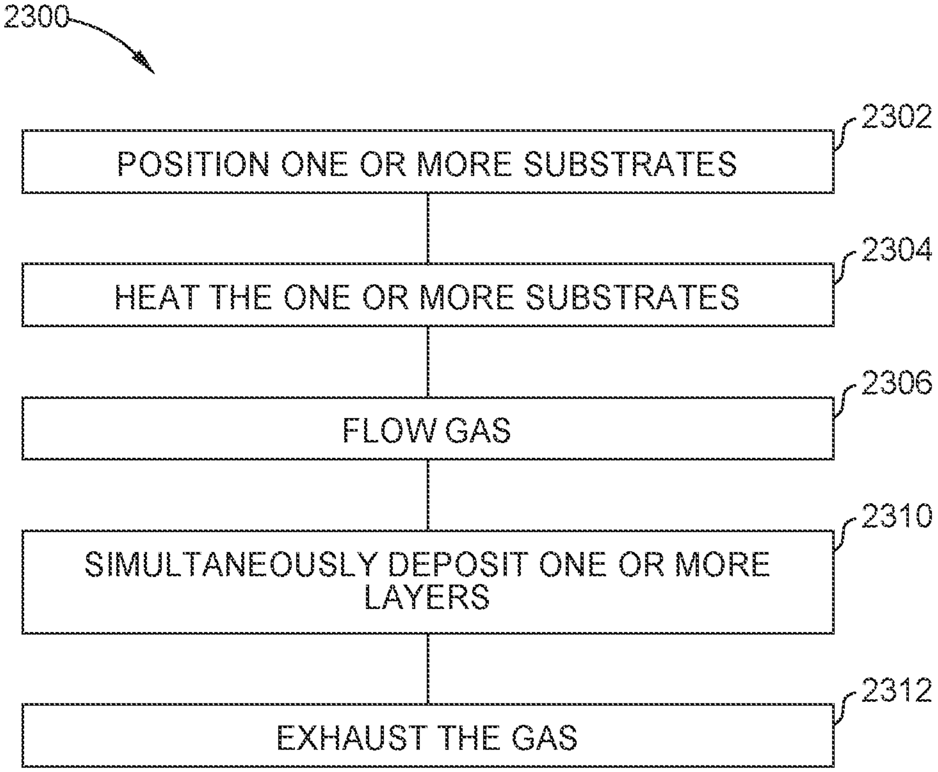
FIG. 23 is a schematic block diagram view of a method of processing substrates for semiconductor manufacturing, according to one implementation.

FIG. 23 is a schematic block diagram view of a method 2300 of processing substrates for semiconductor manufacturing, according to one implementation.

Operation 2302 of the method 2300 includes positioning one or more substrates in a processing volume of a chamber.

Operation 2304 includes heating the one or more substrates. It is contemplated that operation 2304 may occur prior to, subsequent to, and/or concurrent with operation 2306.

Operation 2306 includes flowing gas into the processing volume. The flowing of the gas can include, for example, one or more of the first gas flow P1, the second gas flow P2, the third gas flow P3, and/or the window gas flow WP1.

Operation 2310 includes simultaneously depositing one or more layers on each of the one or more substrates.

Operation 2312 includes exhausting the gas from the processing volume. During the flowing of operation 2306 and/or the exhausting of operation 2312, the gas(es) can follow the various flow paths described herein.

Benefits of the present disclosure include modularity in providing gas flow paths; reliable gas flow uniformity for gas parameters (e.g., gas concentrations, gas temperatures, and/or flow rates); parameter control and adjustability (such as zonal adjustability); thermal uniformity; an deposition uniformity (such as center-to-edge film thickness uniformity). Such benefits can be facilitated for relatively complex deposition operations, such as batch processing operations that process a plurality of substrates simultaneously. Benefits also include enhanced film growth rates and enhanced device performance.

It is contemplated that one or more aspects disclosed herein may be combined. As an example, one or more aspects, features, components, operations, and/or properties of the various implementations of the processing apparatus 100, the controller 1070, the injector 310, the first liner 330, the second liner 350 implementation shown in FIGS. 13 and 14, the third liner 380 implementation shown in FIGS. 15 and 16, the second liner 350 implementation shown in FIGS. 17 and 18, the third liner 380 implementation shown in FIGS. 17 and 18, the processing apparatus 2000, the first liner 2030, the second liner 2050, the third liner 2080, and/or the method 2300 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A process kit applicable for disposition in a processing chamber, comprising:

an injector, comprising:

an inner face, an outer face opposing the inner face, a plurality of first inject openings extending between the inner face and the outer face, the plurality of first inject openings comprising a first row of the first inject openings and a second row of the first inject openings, and a plurality of second inject openings extending between the inner face and the outer face, the plurality of second inject openings aligned between the first row and the second row of the first inject openings;

a first liner sized and shaped to be disposed inwardly of the injector, the first liner comprising:

an inner face, an outer face opposing the inner face of the first liner, a first side face between the inner face of the first liner and the outer face of the first liner, a second side face between the inner face of the first liner and the outer face of the first liner, the second side face opposing the first side face, a plurality of inlet openings on an inlet side of the first liner, the plurality of inlet openings extending into the inner face of the first liner and the second side face, and one or more outlet openings on an outlet side of the first liner, the outlet side opposing the inlet side, and the one or more outlet openings extending into the inner face of the first liner; and a second liner sized and shaped to be supported at least partially by the first liner, the second liner comprising:

an inner face, an outer face opposing the inner face of the second liner, a first side face between the inner face of the second liner and the outer face of the second liner, a second side face between the inner face of the second liner and the outer face of the second liner, the second side face of the second liner opposing the first side face of the second liner, a plurality of inlet openings on an inlet side of the second liner, the plurality of inlet openings of the second liner extending into the outer face of the second liner, and the plurality of inlet openings of the second liner comprising:

a first row extending into the first side face of the second liner and configured to align with the first row of the first inject openings of the injector, and a second row extending into the second side face of the second liner and configured to align with the second row of the first inject openings of the injector, and one or more outlet openings on an outlet side of the second liner, the outlet side of the second liner opposing the inlet side of the second liner, the one or more outlet openings of the second liner extending into the inner face of the second liner.

2. The process kit of claim 1, wherein at least one of the plurality of second inject openings of the injector is aligned at least partially between columns of the first inject openings.

3. The process kit of claim 1, wherein at least one of the plurality of second inject openings of the injector is aligned circumferentially outwardly of the first inject openings.

4. The process kit of claim 3, wherein the first inject openings and the second inject openings each comprise apertures.

5. The process kit of claim 1, wherein the one or more outlet openings of the first liner comprise:

a recess section extending into the inner face of the first liner; and a passage section extending into the recess section.

6. The process kit of claim 5, wherein the plurality of inlet openings of the first liner comprise recesses.

7. The process kit of claim 1, wherein the plurality of inlet openings of the second liner comprise:

a plurality of first inlet openings that include the first row and the second row of the second liner; and a plurality of second inlet openings extending between the inner face of the second liner and the outer face of the second liner, the plurality of second inlet openings of the second liner configured to align with the second inject openings of the injector.

8. The process kit of claim 7, wherein the first row of the plurality of first inlet openings of the second liner comprise first recesses extending into the outer face and the first side face of the second liner, and the second row of the plurality of first inlet openings of the second liner comprise second recesses extending into the outer face and the second side face of the second liner.

9. The process kit of claim 8, wherein the one or more outlet openings of the second liner comprise:

a passage section extending between the first side face and the second side face of the second liner; and an aperture section extending between the inner face of the second liner and the passage section of the second liner.

10. The process kit of claim 1, further comprising a third liner sized and shaped to be supported at least partially by the second liner, the third liner comprising:

an inner face;

an outer face opposing the inner face of the third liner;

a first side face between the inner face of the third liner and the outer face of the third liner;

a second side face between the inner face of the third liner and the outer face of the third liner, the second side face opposing the first side face of the third liner, wherein the second side face of the third liner comprises a tapered section;

a plurality of inlet openings on an inlet side of the third liner, the plurality of inlet openings of the third liner extending into the first side face of the third liner; and one or more outlet openings on an outlet side of the third liner, the outlet side of the third liner opposing the inlet side of the third liner, the one or more outlet openings of the third liner extending into the inner face of the third liner.

11. The process kit of claim 10, wherein the plurality of inlet openings of the third liner extend into the inner face of the third liner, and the one or more outlet openings of the third liner extend into the first side face of the third liner.

12. The process kit of claim 11, wherein the plurality of inlet openings of the third liner comprise recesses, and the one or more outlet openings of the third liner comprise a recess section extending into the inner face and the first side face of the third liner.

13. The process kit of claim 12, wherein the third liner further comprises one or more second inlet openings extending between the first side face and the tapered section of the second side face, and the one or more outlet openings of the third liner further comprise a passage section extending between the recess section and the tapered section.

14. A liner applicable for disposition in a processing chamber, comprising:

an inner face;

an outer face opposing the inner face;

a first side face between the inner face and the outer face;

a second side face between the inner face and the outer face, the second side face opposing the first side face;

a plurality of inlet openings on an inlet side, the plurality of inlet openings extending into the outer face, and the plurality of inlet openings comprising:

a plurality of first inlet openings that include a first row extending into the first side face, and a second row extending into the second side face, the first row of the plurality of first inlet openings comprising first recesses extending into the outer face and the first side face, and the second row of the plurality of first inlet openings comprising second recesses extending into the outer face and the second side face, and a plurality of second inlet openings extending between the inner face and the outer face, the plurality of second inlet openings aligned at least partially between columns of the first inlet openings, the first recesses disposed on a first side of the plurality of second inlet openings, and the second recesses disposed on a second side of the plurality of second inlet openings; and one or more outlet openings on an outlet side, the outlet side opposing the inlet side, and the one or more outlet openings extending into the inner face.

15. The liner of claim 10, wherein the one or more outlet openings comprise:

a passage section extending between the first side face and the second side face; and an aperture section extending between the inner face and the passage section.

16. The liner of claim 14, wherein the first recesses define a plurality of first walls to flow gas over the first walls on the first side, and the second recesses define a plurality of second walls to flow gas over the second walls on the second side.

17. A process kit applicable for disposition in a processing chamber, comprising:

an injector, comprising:

an inner face, an outer face opposing the inner face, a plurality of first inject openings extending between the inner face and the outer face, the plurality of first inject openings comprising a first row of the first inject openings and a second row of the first inject openings, and a plurality of second inject openings extending between the inner face and the outer face, the plurality of second inject openings aligned between the first row and the second row of the first inject openings;

a first liner sized and shaped to be disposed inwardly of the injector, the first liner comprising:

an inner face, an outer face opposing the inner face of the first liner, a first side face between the inner face of the first liner and the outer face of the first liner, a second side face between the inner face of the first liner and the outer face of the first liner, the second side face opposing the first side face, a plurality of inlet openings on an inlet side of the first liner, the plurality of inlet openings extending into the inner face of the first liner and the second side face, and one or more outlet openings on an outlet side of the first liner, the outlet side opposing the inlet side, and the one or more outlet openings extending into the inner face of the first liner;

a second liner sized and shaped to be supported at least partially by the first liner, the second liner comprising:

an inner face, an outer face opposing the inner face of the second liner, a first side face between the inner face of the second liner and the outer face of the second liner, a second side face between the inner face of the second liner and the outer face of the second liner, the second side face of the second liner opposing the first side face of the second liner, a plurality of inlet openings on an inlet side of the second liner, the plurality of inlet openings of the second liner extending into the outer face of the second liner, and one or more outlet openings on an outlet side of the second liner, the outlet side of the second liner opposing the inlet side of the second liner, the one or more outlet openings of the second liner extending into the inner face of the second liner; and a third liner sized and shaped to be supported at least partially by the second liner, the third liner comprising:

an inner face, an outer face opposing the inner face of the third liner, a first side face between the inner face of the third liner and the outer face of the third liner, a second side face between the inner face of the third liner and the outer face of the third liner, the second side face opposing the first side face of the third liner, wherein the second side face of the third liner comprises a tapered section, a plurality of inlet openings on an inlet side of the third liner, the plurality of inlet openings of the third liner extending into the first side face of the third liner, and one or more outlet openings on an outlet side of the third liner, the outlet side of the third liner opposing the inlet side of the third liner, the one or more outlet openings of the third liner extending into the inner face of the third liner.

18. The process kit of claim 17, wherein the plurality of inlet openings of the third liner extend into the inner face of the third liner, and the one or more outlet openings of the third liner extend into the first side face of the third liner.

19. The process kit of claim 18, wherein the plurality of inlet openings of the third liner comprise recesses, and the one or more outlet openings of the third liner comprise a recess section extending into the inner face and the first side face of the third liner.

20. The process kit of claim 19, wherein the third liner further comprises one or more second inlet openings extending between the first side face and the tapered section of the second side face, and the one or more outlet openings of the third liner further comprise a passage section extending between the recess section and the tapered section.

* * * * *